(12) United States Patent
Todorokihara

(10) Patent No.: US 8,593,131 B2
(45) Date of Patent: Nov. 26, 2013

(54) SIGNAL GENERATION CIRCUIT, FREQUENCY MEASUREMENT DEVICE INCLUDING THE SIGNAL GENERATION CIRCUIT, AND SIGNAL GENERATION METHOD

(75) Inventor: Masayoshi Todorokihara, Munich (DE)

(73) Assignee: Seiko Epson Corporation, Tokyo (JP)

( * ) Notice: Subject to any disclaimer, the term of this patent is extended or adjusted under 35 U.S.C. 154(b) by 262 days.

(21) Appl. No.: 12/889,770

(22) Filed: Sep. 24, 2010

(65) Prior Publication Data

US 2011/0084687 A1 Apr. 14, 2011

(30) Foreign Application Priority Data

Oct. 8, 2009 (JP) ................. 2009-234514

(51) Int. Cl.
*G01R 23/00* (2006.01)
(52) U.S. Cl.
USPC ...................................... 324/76.19
(58) Field of Classification Search
USPC ...................................... 324/76.19
See application file for complete search history.

(56) References Cited

U.S. PATENT DOCUMENTS

| | | | |
|---|---|---|---|
| 2,627,033 A | 1/1953 | Jensen et al. | |
| 2,840,812 A | 6/1958 | Di Giacomo | |
| 2,944,219 A * | 7/1960 | Tanaka et al. | 327/115 |
| 3,026,473 A | 3/1962 | De Mott | |
| 3,056,085 A | 9/1962 | James et al. | |
| 3,144,623 A | 8/1964 | Steiner | |
| 3,227,952 A | 1/1966 | Proebster et al. | |
| 3,310,660 A | 3/1967 | Cogar | |
| 3,372,346 A * | 3/1968 | Rogers et al. | 331/2 |
| 3,407,290 A | 10/1968 | Atrubin | |
| 3,440,617 A | 4/1969 | Lesti | |
| 3,486,007 A | 12/1969 | Jacobson | |
| 3,551,826 A * | 12/1970 | Sepe | 327/119 |
| 3,553,579 A | 1/1971 | Teixeira | |
| 3,557,796 A | 1/1971 | Keller et al. | |
| 3,605,017 A | 9/1971 | Chertok et al. | |
| 3,609,308 A | 9/1971 | Lemon et al. | |

(Continued)

FOREIGN PATENT DOCUMENTS

| | | |
|---|---|---|
| JP | 53-111768 | 9/1978 |
| JP | A-56-169923 | 12/1981 |

(Continued)

OTHER PUBLICATIONS

Katano, K., "Introduction to Proper Method for Using Measuring Instruments; How to Use Timing Devices," Transistor Technology Seminar, $14^{th}$ Installment, Feb. 1994, p. 331-338 (with English translation).

(Continued)

*Primary Examiner* — Jermele M Hollington
*Assistant Examiner* — Demetrius Pretlow
(74) *Attorney, Agent, or Firm* — Oliff & Berridge, PLC

(57) ABSTRACT

A signal generation circuit includes: a first signal source that generates a first signal; and a variable rate frequency divider section that generates a variable rate frequency-divided signal in which a first frequency-divided signal obtained by frequency-dividing the first signal by a first frequency dividing ratio and a second frequency-divided signal obtained by frequency-dividing the first signal by a second frequency dividing ratio temporally alternately appear in a specified mixing ratio.

10 Claims, 27 Drawing Sheets

(56) References Cited

U.S. PATENT DOCUMENTS

| | | | |
|---|---|---|---|
| 3,624,494 A | 11/1971 | Turan | |
| 3,652,838 A | 3/1972 | Dillon et al. | |
| 3,686,565 A | 8/1972 | Kelem et al. | |
| 3,697,870 A | 10/1972 | Brenner | |
| 3,704,414 A | 11/1972 | Herbst | |
| 3,708,686 A | 1/1973 | Butler, Jr. et al. | |
| 3,733,471 A | 5/1973 | Gilberg | |
| 3,736,510 A | 5/1973 | Wu | |
| 3,742,353 A | 6/1973 | Parisi | |
| 3,743,940 A | 7/1973 | Yamagata | |
| 3,745,380 A | 7/1973 | Kitajima et al. | |
| 3,750,014 A | 7/1973 | Gaw | |
| 3,755,734 A | 8/1973 | Blanyer | |
| 3,761,740 A | 9/1973 | Naïve | |
| 3,766,818 A | 10/1973 | Prohofsky | |
| 3,775,681 A | 11/1973 | Konrad | |
| 3,777,121 A | 12/1973 | Jamieson | |
| 3,780,346 A | 12/1973 | Gagnon | |
| 3,795,771 A | 3/1974 | Gundersen et al. | |
| 3,803,487 A | 4/1974 | Iten | |
| 3,812,427 A | 5/1974 | Coulter | |
| 3,823,374 A | 7/1974 | Dandliker et al. | |
| 3,838,338 A | 9/1974 | Khoury | |
| 3,875,518 A | 4/1975 | Odams | |
| 3,930,199 A | 12/1975 | Valis | |
| 3,942,123 A | 3/1976 | Georgi | |
| 3,943,460 A | 3/1976 | Arai | |
| 4,041,387 A | 8/1977 | Dalichow et al. | |
| 4,051,434 A | 9/1977 | Sweet | |
| 4,053,839 A | 10/1977 | Knoedl | |
| 4,063,169 A | 12/1977 | Palmer | |
| 4,130,799 A | 12/1978 | Cherry | |
| 4,137,497 A | 1/1979 | Lowenschuss | |
| 4,139,819 A | 2/1979 | Worley | |
| 4,139,870 A | 2/1979 | Tachi | |
| 4,144,490 A | 3/1979 | Stevens | |
| 4,150,432 A | 4/1979 | Sorden | |
| 4,169,213 A | 9/1979 | Dye et al. | |
| 4,310,891 A | 1/1982 | Niki | |
| 4,339,722 A | 7/1982 | Sydor et al. | |
| 4,345,206 A | 8/1982 | Skalka | |
| 4,368,354 A | 1/1983 | Furihata et al. | |
| 4,374,358 A | 2/1983 | Hirose | |
| 4,389,642 A | 6/1983 | Kahn | |
| 4,420,809 A | 12/1983 | Pierce | |
| 4,494,067 A | 1/1985 | Barszczewski | |
| 4,514,592 A | 4/1985 | Miyaguchi | |
| 4,544,892 A | 10/1985 | Kaufman et al. | |
| 4,546,490 A | 10/1985 | Miller-Thomson et al. | |
| 4,583,211 A | 4/1986 | Nishikawa et al. | |
| 4,588,979 A | 5/1986 | Adams | |
| 4,603,292 A | 7/1986 | Russell | |
| 4,609,990 A | 9/1986 | Sember et al. | |
| 4,616,173 A | 10/1986 | Cook et al. | |
| 4,651,089 A | 3/1987 | Haigh | |
| 4,667,689 A | 5/1987 | Kohashi | |
| 4,670,712 A | 6/1987 | Lavergnat et al. | |
| 4,672,556 A | 6/1987 | Shepler | |
| 4,695,791 A | 9/1987 | Miller | |
| 4,695,792 A | 9/1987 | Roy | |
| 4,707,653 A | 11/1987 | Wagner | |
| 4,716,363 A | 12/1987 | Dukes et al. | |
| 4,760,536 A * | 7/1988 | Curtis | 702/71 |
| 4,769,836 A * | 9/1988 | Aihara | 379/361 |
| 4,795,963 A | 1/1989 | Ueno et al. | |
| 4,864,588 A | 9/1989 | Simpson et al. | |
| 4,864,634 A * | 9/1989 | Nakagawa et al. | 455/76 |
| 4,866,260 A | 9/1989 | Lescourret | |
| 4,880,005 A | 11/1989 | Pless et al. | |
| 4,942,365 A | 7/1990 | Satterwhite | |
| 4,984,254 A | 1/1991 | Thomas | |
| 5,027,228 A | 6/1991 | Yokoyama | |
| 5,065,095 A | 11/1991 | Suzuki | |
| 5,095,279 A * | 3/1992 | Quan et al. | 327/129 |
| 5,122,758 A | 6/1992 | Tomita | |
| 5,128,607 A | 7/1992 | Clark et al. | |
| 5,157,699 A | 10/1992 | Miyazaki et al. | |
| 5,168,215 A | 12/1992 | Puzzo | |
| 5,206,549 A | 4/1993 | Suzuki et al. | |
| 5,262,714 A | 11/1993 | Friedman | |
| 5,302,916 A | 4/1994 | Pritchett | |
| 5,304,938 A | 4/1994 | Gregory et al. | |
| 5,313,154 A | 5/1994 | Norris | |
| 5,317,215 A | 5/1994 | Kranzler | |
| 5,323,096 A | 6/1994 | Nakai | |
| 5,365,181 A | 11/1994 | Mair | |
| 5,381,085 A | 1/1995 | Fischer | |
| 5,442,278 A | 8/1995 | Fan Chiang et al. | |
| 5,448,606 A | 9/1995 | Snelgrove | |
| 5,471,133 A | 11/1995 | Sezi | |
| 5,509,040 A | 4/1996 | Shimada | |
| 5,539,355 A | 7/1996 | Nakamura | |
| 5,555,247 A | 9/1996 | Matsuoka et al. | |
| 5,650,954 A | 7/1997 | Minuhin | |
| 5,652,552 A | 7/1997 | Chung | |
| 5,710,710 A | 1/1998 | Owen et al. | |
| 5,764,045 A | 6/1998 | Hayashi | |
| 5,941,974 A | 8/1999 | Babin | |
| 6,018,560 A | 1/2000 | Kim | |
| 6,078,200 A * | 6/2000 | Miyano | 327/142 |
| 6,127,950 A | 10/2000 | Yamauchi | |
| 6,140,869 A | 10/2000 | Troise | |
| 6,172,579 B1 | 1/2001 | Dacus et al. | |
| 6,181,829 B1 | 1/2001 | Clark et al. | |
| 6,259,251 B1 | 7/2001 | Sugiura et al. | |
| 6,265,869 B1 | 7/2001 | Takahashi | |
| 6,282,803 B1 | 9/2001 | Dunne | |
| 6,359,938 B1 | 3/2002 | Keevill et al. | |
| 6,360,090 B1 | 3/2002 | Holcombe et al. | |
| 6,377,616 B1 | 4/2002 | Brankovic et al. | |
| 6,411,075 B1 | 6/2002 | Battiston et al. | |
| 6,463,452 B1 | 10/2002 | Schulist | |
| 6,519,194 B2 | 2/2003 | Tsujino et al. | |
| 6,549,479 B2 | 4/2003 | Blodgett | |
| 6,566,964 B1 | 5/2003 | Hirano | |
| 6,590,400 B2 | 7/2003 | Hilliard et al. | |
| 6,665,367 B1 | 12/2003 | Blair | |
| 6,674,277 B1 | 1/2004 | Oishi et al. | |
| 6,675,326 B1 | 1/2004 | Yoshizaki | |
| 6,680,607 B2 | 1/2004 | Smith | |
| 6,759,838 B2 | 7/2004 | Tao et al. | |
| 6,834,093 B1 | 12/2004 | Chiu | |
| 6,888,902 B1 | 5/2005 | Kondo | |
| 6,917,191 B2 | 7/2005 | Oishi et al. | |
| 7,027,940 B2 | 4/2006 | Iannuzzi | |
| 7,046,964 B1 | 5/2006 | Sullivan et al. | |
| 7,068,744 B2 | 6/2006 | Watanabe | |
| 7,124,153 B2 | 10/2006 | Grushin | |
| 7,230,458 B2 | 6/2007 | DaDalt | |
| 7,242,223 B1 | 7/2007 | Alon | |
| 7,265,559 B1 | 9/2007 | Hladky et al. | |
| 7,266,756 B2 | 9/2007 | Saado et al. | |
| 7,271,631 B2 | 9/2007 | Watanabe | |
| 7,276,978 B2 | 10/2007 | Puma et al. | |
| 7,285,961 B2 | 10/2007 | Shinmoto et al. | |
| 7,372,875 B2 | 5/2008 | Hadzic et al. | |
| 7,394,723 B2 | 7/2008 | Rubin | |
| 7,409,031 B1 | 8/2008 | Lee et al. | |
| 7,429,896 B2 | 9/2008 | Hattori | |
| 7,436,265 B2 | 10/2008 | Park et al. | |
| 7,463,096 B2 | 12/2008 | Chi et al. | |
| 7,466,789 B2 | 12/2008 | Rieubon et al. | |
| 7,504,976 B1 | 3/2009 | Pellon | |
| 7,560,962 B2 | 7/2009 | Kamath | |
| 7,636,747 B2 | 12/2009 | Watanabe | |
| 7,642,767 B2 | 1/2010 | Willis | |
| 7,653,170 B2 | 1/2010 | Mattes et al. | |
| 7,692,419 B1 | 4/2010 | Peel | |
| 7,696,741 B2 | 4/2010 | Gurr | |
| 7,729,071 B2 | 6/2010 | Harada | |
| 7,737,688 B2 | 6/2010 | Tomida et al. | |
| 7,750,618 B1 | 7/2010 | Fang et al. | |
| 7,750,685 B1 | 7/2010 | Bunch | |
| 7,804,289 B2 | 9/2010 | Li | |

(56) References Cited

U.S. PATENT DOCUMENTS

| | | |
|---|---|---|
| 7,847,597 B1 | 12/2010 | Chan et al. |
| 7,907,016 B2 | 3/2011 | Eikenbroek |
| 7,932,751 B2 | 4/2011 | Boomer |
| 8,139,685 B2 | 3/2012 | Simic et al. |
| 8,140,283 B2 | 3/2012 | Banmouyal et al. |
| 8,242,941 B2 | 8/2012 | Arknaes-Pedersen et al. |
| 8,258,831 B1 | 9/2012 | Banai et al. |
| 2001/0045868 A1 | 11/2001 | Takeyabu et al. |
| 2001/0048348 A1 | 12/2001 | Unterricker |
| 2002/0024343 A1 | 2/2002 | Moore |
| 2002/0097091 A1 | 7/2002 | Takagishi |
| 2002/0167874 A1 | 11/2002 | Hayashi |
| 2002/0180415 A1 | 12/2002 | Roth |
| 2003/0038624 A1 | 2/2003 | Hilliard et al. |
| 2003/0046064 A1 | 3/2003 | Moriya et al. |
| 2003/0165112 A1 | 9/2003 | Noda |
| 2003/0176932 A1 | 9/2003 | Wild |
| 2003/0184346 A1 | 10/2003 | Lamb |
| 2003/0215100 A1 | 11/2003 | Kimura et al. |
| 2004/0075425 A1 | 4/2004 | Horio et al. |
| 2004/0078737 A1 | 4/2004 | Miyamoto |
| 2004/0196052 A1 | 10/2004 | Okayasu |
| 2004/0199345 A1 | 10/2004 | Ananthanarayanan et al. |
| 2005/0025270 A1* | 2/2005 | Muhammad et al. ......... 375/346 |
| 2005/0110500 A1 | 5/2005 | Hoyte et al. |
| 2005/0147197 A1 | 7/2005 | Perrott |
| 2005/0237125 A1 | 10/2005 | Hino |
| 2005/0270043 A1 | 12/2005 | Iacob et al. |
| 2006/0084386 A1* | 4/2006 | Irie et al. ................. 455/63.1 |
| 2006/0120537 A1 | 6/2006 | Burnett et al. |
| 2006/0171496 A1 | 8/2006 | Nakamuta et al. |
| 2006/0246865 A1 | 11/2006 | Makarov |
| 2006/0267698 A1 | 11/2006 | Erdogan et al. |
| 2006/0285756 A1 | 12/2006 | Sugita |
| 2007/0094581 A1 | 4/2007 | Kajita |
| 2007/0103333 A1 | 5/2007 | Michaiski et al. |
| 2007/0132442 A1 | 6/2007 | Jones |
| 2007/0159938 A1 | 7/2007 | Sugawara et al. |
| 2007/0216556 A1 | 9/2007 | Rieubon et al. |
| 2008/0019471 A1 | 1/2008 | Waldner |
| 2008/0068096 A1 | 3/2008 | Feng et al. |
| 2008/0104072 A1 | 5/2008 | Stampleman et al. |
| 2008/0122498 A1 | 5/2008 | Furukawa |
| 2008/0136471 A1 | 6/2008 | Kamath |
| 2008/0165862 A1* | 7/2008 | Takahashi ............... 375/240.28 |
| 2008/0189064 A1 | 8/2008 | Yamaguchi et al. |
| 2008/0191762 A1 | 8/2008 | Seethamraju et al. |
| 2008/0204088 A1 | 8/2008 | Garlapati et al. |
| 2008/0229829 A1 | 9/2008 | Kondo |
| 2008/0247500 A1 | 10/2008 | Goto et al. |
| 2008/0291287 A1 | 11/2008 | Dvir |
| 2008/0320065 A1 | 12/2008 | Kan |
| 2009/0058452 A1 | 3/2009 | Tanaka et al. |
| 2009/0058468 A1 | 3/2009 | Hjelm et al. |
| 2009/0144018 A1 | 6/2009 | Chang et al. |
| 2009/0153256 A1* | 6/2009 | Jo et al. .................... 331/40 |
| 2009/0156150 A1 | 6/2009 | Deleon |
| 2009/0180527 A1 | 7/2009 | Asami |
| 2009/0192958 A1 | 7/2009 | Todorokihara |
| 2009/0237070 A1 | 9/2009 | Herselman |
| 2009/0240994 A1 | 9/2009 | Lee |
| 2009/0243736 A1 | 10/2009 | Miura et al. |
| 2009/0251129 A1 | 10/2009 | Todorokihara et al. |
| 2009/0261809 A1 | 10/2009 | Li |
| 2009/0295460 A1 | 12/2009 | Gulba et al. |
| 2009/0296878 A1 | 12/2009 | Tsai |
| 2010/0052653 A1 | 3/2010 | Lebrun |
| 2010/0054390 A1 | 3/2010 | Kim et al. |
| 2010/0091752 A1 | 4/2010 | Kemmochi et al. |
| 2010/0213924 A1 | 8/2010 | Osumi et al. |
| 2010/0289479 A1 | 11/2010 | Prance et al. |
| 2010/0295535 A1 | 11/2010 | Todorokihara |
| 2010/0295536 A1 | 11/2010 | Todorokihara |
| 2010/0295537 A1 | 11/2010 | Todorokihara |
| 2010/0315061 A1 | 12/2010 | Tomita et al. |
| 2011/0050352 A1 | 3/2011 | Kondo et al. |
| 2011/0068828 A1 | 3/2011 | Anderson et al. |
| 2011/0074514 A1 | 3/2011 | Marutani |
| 2011/0082656 A1 | 4/2011 | Todorokihara |
| 2011/0084687 A1 | 4/2011 | Todorokihara |
| 2011/0150168 A1 | 6/2011 | Tseng et al. |
| 2011/0182398 A1 | 7/2011 | Iwashita et al. |
| 2011/0235772 A1 | 9/2011 | Obkircher |
| 2012/0019301 A1 | 1/2012 | Murray |
| 2012/0053903 A1 | 3/2012 | Todorokihara |
| 2012/0161815 A1 | 6/2012 | Polivka |

FOREIGN PATENT DOCUMENTS

| | | |
|---|---|---|
| JP | A-61-223662 | 10/1986 |
| JP | A-62-298726 | 12/1987 |
| JP | A-64-054271 | 3/1989 |
| JP | A-64-57189 | 3/1989 |
| JP | A-02-252306 | 10/1990 |
| JP | A-04-048271 | 2/1992 |
| JP | A-04-072815 | 3/1992 |
| JP | A-04-357468 | 12/1992 |
| JP | A-05-030772 | 4/1993 |
| JP | A-5-172861 | 7/1993 |
| JP | A-05-327515 | 12/1993 |
| JP | A-06-011525 | 1/1994 |
| JP | A-06-501554 | 2/1994 |
| JP | A-06-164372 | 6/1994 |
| JP | A-06-235743 | 8/1994 |
| JP | A-06-342021 | 12/1994 |
| JP | A-07-055554 | 3/1995 |
| JP | A-07-229910 | 8/1995 |
| JP | A-7-260526 | 10/1995 |
| JP | A-09-178785 | 7/1997 |
| JP | A-9-304259 | 11/1997 |
| JP | A-10-132874 | 5/1998 |
| JP | A-10-170566 | 6/1998 |
| JP | A-09-178785 | 7/1998 |
| JP | A-11-220369 | 8/1999 |
| JP | A-11-264846 | 9/1999 |
| JP | A-2001-094395 | 4/2001 |
| JP | A-2001-119291 | 4/2001 |
| JP | A-2001-166008 | 6/2001 |
| JP | A-2001-177378 | 6/2001 |
| JP | A-2003-065768 | 3/2003 |
| JP | A-2003-194860 | 7/2003 |
| JP | A-2003-249905 | 9/2003 |
| JP | A-2003-307481 | 10/2003 |
| JP | A-2003-315356 | 11/2003 |
| JP | A-2005-020554 | 1/2005 |
| JP | A-2006-029874 | 2/2006 |
| JP | A-2007-060447 | 3/2007 |
| JP | A-2008-131500 | 6/2008 |
| JP | A-2009-229353 | 10/2009 |
| JP | A-2009-250807 | 10/2009 |
| JP | A-2009-250808 | 10/2009 |
| JP | A-2010-085286 | 4/2010 |
| JP | A-2010-127914 | 6/2010 |
| JP | A-2010-271210 | 12/2010 |
| JP | A-2010-271211 | 12/2010 |
| WO | WO 85-04487 A | 10/1985 |
| WO | WO 92/04634 A1 | 3/1992 |

OTHER PUBLICATIONS

Oct. 11, 2011 Office Action issued in U.S. Appl. No. 12/418,000.
Feb. 29, 2012 Office Action issued in U.S. Appl. No. 12/782,382.
Mar. 7, 2012 Office Action issued in U.S. Appl. No. 12/418,000.
Office Action issued Dec. 14, 2011 in U.S. Appl. No. 12/782,382.
Office Action issued Dec. 29, 2011 in U.S. Appl. No. 12/783,900.
Office Action issued Dec. 29, 2011 in U.S. Appl. No. 12/835,108.
Office Action issued Jan. 6, 2012 in U.S. Appl. No. 12/784,136.
Jul. 23, 2012 Office Action issued in U.S. Appl. No. 12/835,108.
Jul. 31, 2012 Office Action issued in U.S. Appl. No. 12/418,000.
Sep. 14, 2012 Office Action issued in U.S. Appl. No. 12/784,136.
Sep. 19, 2012 Office Action dated issued in U.S. Appl. No. 12/782,382.

(56) References Cited

OTHER PUBLICATIONS

Sep. 27, 2012 Office Action Issued in U.S. Appl. No. 12/783,900.
U.S. Appl. No. 12/783,900 in the name of Todoroklhara, filed May 20, 2010.
U.S. Appl. No. 12/835,108 in the name of Kondo, filed Jul. 13, 2010.
U.S. Appl. No. 12/784,136 in the name of Todorokihara, filed May 20, 2010.
U.S. Appl. No. 12/782,382 in the name of Todorokihara, filed May 18, 2010.
U.S. Appl. No. 12/418,000 in the name of Todorokihara, filed Apr. 3, 2009.
U.S. Appl. No. 12/896,106 in the name of Todorokihara, filed Oct. 1, 2010.
U.S. Appl. No. 13/211,726 in the name of Todorokihara, filed Aug. 17, 2011.
Nov. 13, 2012 Office Action issued in U.S. Appl. No. 12/896,106.
Nov. 28, 2012 Office Action issued in U.S. Appl. No. 12/418,000.
Nov. 30, 2012 Notice of Allowance issued in U.S. Appl. No. 12/782,382.
Feb. 6, 2013 Notice of Allowance issued in U.S. Appl. No. 12/784,136.
Jan. 14, 2013 Advisory Action issued in U.S. Appl. No. 12/783,900.
Jan. 28, 2013 Office Action issued in U.S. Appl. No. 12/783,900.
Apr. 8, 2013 Office Action issued in U.S. Appl. No. 12/835,108.
Mar. 13, 2013 Notice of Allowance issued in U.S. Appl. No. 12/782,382.
Office Action dated May 25, 2012 issued in U.S. Appl. No. 12/782,382.
Office Action dated May 30, 3012 issued in U.S. Appl. No. 12/783,900.
Office Action dated May 23, 2012 issued in U.S. Appl. No. 12/784,136.
Office Action dated Jun. 5, 2012 issued in U.S. Appl. No. 12/418,000.
Jun. 12, 2013 Notice of Allowance issued in U.S. Appl. No. 12/783,900.
Jul. 8, 2013 Office Action issued in U.S. Appl. No. 12/896,106.
Jul. 11, 2013 Corrected Notice of Allowability issued in U.S. Appl. No. 12/782,382.
Sep. 10, 2013 Notice of Allowance issued in U.S. Appl. No. 12/835,108.
Sep. 25, 2013 Office Action Issued in U.S. Appl. No. 13/211,726.

* cited by examiner

| Reference clock | No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|---|---|---|---|---|---|---|---|---|---|---|---|---|---|---|---|
| External storage | $\alpha$ | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |
| | $\beta$ | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 |
| | c | 0 | 4 | 4 | 8 | 8 | 12 | 12 | 16 | 0 | 4 | 4 | 8 | 8 | 12 | 12 | 12 | 16 | 0 | 4 | 4 | 8 | 8 | 12 | 12 | 16 | 0 | 4 | 4 | 4 |
| Calculation section | $c \geq \alpha+\beta$ | 0 | 0 | 0 | 0 | 0 | 0 | 0 | 1 | 0 | 0 | 0 | 0 | 0 | 1 | 1 | 1 | 0 | 0 | 0 | 0 | 0 | 0 | 0 | 0 | 1 | 0 | 0 | 0 | 1 |
| | Control signal | 0 | 1 | 0 | 0 | 0 | 0 | 0 | 0 | 1 | 0 | 1 | 0 | 1 | 1 | 1 | 0 | 0 | 0 | 0 | 0 | 0 | 0 | 0 | 0 | 1 | 1 | 1 | 1 | 1 |
| | 1-bit counter | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 |
| Variable rate frequency-divided signal generation section | Variable rate clock | 1 | 0 | 1 | 0 | 1 | 0 | 1 | 0 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |

Divide-by-2, Divide-by-2, Divide-by-2, Divide-by-2, Divide-by-3, Divide-by-2, Divide-by-2, Divide-by-2, Divide-by-3, Divide-by-2, Divide-by-2, Divide-by-2, Divide-by-2

FIG. 22

SIGNAL GENERATION CIRCUIT, FREQUENCY MEASUREMENT DEVICE INCLUDING THE SIGNAL GENERATION CIRCUIT, AND SIGNAL GENERATION METHOD

The present application claims a priority based on Japanese Patent Application No. 2009-234514 filed on Oct. 8, 2009, the contents of which are incorporated herein by reference.

BACKGROUND

1. Technical Field

The invention relates to measurement of frequency and, more particularly, to devices capable of detecting very small changes in frequency, and signal generation circuits and signal generation methods that can be used for the devices.

2. Related Art

As frequency measurement systems, a direct count system and a reciprocal system are known. According to the direct count system, pulses passing within a predetermined gate time are counted (see, for example, Japanese laid-open patent application JP-A-2001-119291). According to the reciprocal system, a pulse period is accurately measured, and a frequency is obtained from its time reciprocal (see, for example, Japanese laid-open patent application JP-A-5-172861). The direct count system may be realized with a relatively small-scale circuit, but a long gate time may be needed to obtain a higher frequency resolving power (for example, a gate time needed for obtaining a resolving power of 0.1 Hz is 10 seconds). The reciprocal system can overcome this short-coming, but its circuit for accurately measuring pulse intervals becomes larger in scale, compared to that of the direct count system.

When a very small change in mass is to be detected, for example, when the presence or absence of odor substance adhered to a sensor wants to be detected, a method using changes in the frequency of the sensor caused by adhesion of substance may be utilized. For example, by using a QCM (Quartz Crystal Microbalance) method using a quartz oscillator as the sensor, a small change in mass on the surface of the oscillator can be converted to a frequency change. By using the oscillators and providing materials to which odor compositions adhere on the oscillators' surfaces, various kinds of odor sensors can be formed. Odor compositions may be each composed of a unit substance or multiple substances. As sample gas is supplied to the odor sensor, its odor compositions adhere to the sensor and change the mass at the surfaces of the oscillators, whereby the frequency of the oscillator changes, A single sensor or plural kinds of sensors may be prepared to observe the change, whereby the presence of specified odor composition can be detected.

In order to detect a frequency change of each of the odor sensors, a counter and a signal processing circuit for detecting the frequency change need to be added to each sensor output. Furthermore, although the frequency (for example, 30 MHz) of a quartz oscillator changes by adhered substance, the change is only on the order of several Hz to several hundreds Hz, and the change could be less than 1 Hz. As described above, the direct count system has a low frequency resolving power, and thus needs to take a substantially long gate time in order to improve its frequency resolving power. As errors that could occur at the time of measurement, plus/minus 1 count errors and errors caused by jitter at trigger level could occur, and in addition, errors that originate from the oscillation stability of the quartz oscillators would be superposed on the foregoing errors. The use of reciprocal system counters may supplement for the deficiencies described above, but would not be suitable for a sensor array that is equipped with many sensors, because the circuit scale of each of the counters becomes large.

SUMMARY

In accordance with an advantage of some aspects of the invention, it is possible to provide a frequency change measuring device with an improved frequency measurement resolving power using a relatively simple circuit. In particular, it is possible to provide a signal generation circuit that may be used to suppress generation of pattern noise that could be generated in a frequency measurement device and the like.

In accordance with an embodiment of the invention, a signal generation circuit is equipped with a first signal source that generates a first signal, and a variable rate frequency divider section that generates a variable rate frequency-divided signal in which a first frequency-divided signal obtained by frequency-dividing the first signal by a first frequency dividing ratio and a second frequency-divided signal obtained by frequency-dividing the first signal by a second frequency dividing ratio temporally alternately appear in a specified mixing ratio.

By the structure described above, it is possible to generate a variable rate frequency-divided signal that includes frequency components of the first frequency-divided signal and frequency components of the second frequency-divided signal at a predetermined mixing ratio. It is noted here that the first frequency-divided signal and the second frequency-divided signal can be readily generated by a digital circuit based on the first signal. In other words, the variable rate frequency-divided signal described above can be generated without using an analog circuit that would likely become large in circuit scale. Also, the signal generation circuit having the structure described above is suitable to be used in a frequency measurement device, and can suppress generation of pattern noise that can occur in the frequency measurement device.

Also, the variable rate frequency divider section may preferably be structured to generate the variable rate frequency-divided signal through repeating: a process 1) of adding a first constant indicating a ratio of the first frequency-divided signal included in the variable rate frequency-divided signal to a first variable, a process 2-1) of, when the first variable after the addition becomes greater than a result of addition of the first constant and a second constant indicating a ratio of the second frequency-divided signal included in the variable rate frequency-divided signal, outputting the first frequency-divided signal, subtracting the first constant and the second constant from the first variable, and returning to the process 1), and a process 2-2) of, when the first variable after the addition becomes smaller than a result of addition of the first constant and the second constant, outputting the second frequency-divided signal and returning to the process 1).

By the structure described above, the variable rate frequency-divided signal in which the first frequency-divided signal and the second frequency-divided signal are mixed in a dispersed manner can be generated.

In accordance with another embodiment of the invention, a frequency measurement device is equipped with any one of the signal generation circuits, a source of signal to be measured that generates a signal to be measured, a counter section that outputs a count value obtained by counting the number of changes in the signal to be measured included in a specified period that is determined based on the variable rate frequency-divided signal, and a low-pass filter that removes high frequency components included in the count value, In accordance with still another embodiment of the invention, a frequency measurement device is equipped with any one of the signal generation circuits, a reference frequency signal source that generates a reference frequency signal, a counter section that outputs a count value obtained by counting the number of changes in the variable rate frequency-divided signal included in a specified period that is determined based on the reference frequency signal, and a low-pass filter that removes high frequency components included in the count value.

By the frequency measurement device having the structure described above, by composing at least the signal generation circuit by a digital circuit, the ratio of analog circuits to be used in the device can be reduced, such that the device can be made smaller in size and achieve power saving.

Moreover, the first frequency dividing ratio, the second frequency dividing ratio and the mixing ratio of the variable rate frequency-divided signal may preferably be decided based on pre-obtained noise level distribution characteristics versus frequency ratios between the frequency of the variable frequency-divided signal and the frequency of the signal to be measured.

Also, the first frequency dividing ratio, the second frequency dividing ratio and the mixing ratio of the variable rate frequency-divided signal may preferably be decided based on pre-obtained noise level distribution characteristics versus frequency ratios between the frequency of the variable frequency-divided signal and the frequency of the reference frequency signal.

According to the frequency measurement device having the structure described above, the noise level in the frequency measurement can be suppressed by using the first frequency-divided signal and the second frequency-divided signal.

Also, the signal to be measured and the variable rate frequency-divided signal have an operating point parameter that is defined by the fractional part of a ratio x/y where x is the frequency of the signal to be measured and y is the frequency of the variable rate frequency-divided signal, wherein the frequency of the signal to be measured, and the first frequency dividing ratio, the second frequency dividing ratio and the mixing ratio of the variable rate frequency-divided signal may preferably be decided such that the value of the operating point parameter does not become a neighborhood value of a specified rational number where noise level increases.

Furthermore, the reference frequency signal and the variable rate frequency-divided signal have an operating point parameter that is defined by the fractional part of a ratio x/y where x is the frequency of the variable rate frequency-divided signal and y is the frequency of the reference frequency signal, wherein the frequency of the reference frequency signal, and the first frequency dividing ratio, the second frequency dividing ratio and the mixing ratio of the variable rate frequency-divided signal may preferably be decided such that the value of the operating point parameter does not become a neighborhood value of a specified rational number where noise level increases.

According to the frequency measurement device having the structure described above, the noise level in the frequency measurement using the device can be effectively suppressed.

In accordance with an embodiment of the invention, a signal generation method includes:

a step of, based on a first signal having a specified frequency, generating a first frequency-divided signal obtained by frequency-dividing the first signal by a first frequency dividing ratio and a second frequency-divided signal obtained by frequency-dividing the first signal by a second frequency dividing ratio; and a process of repeating:

a step 1) of adding a first constant indicating a ratio of the first frequency-divided signal included in a variable rate frequency-divided signal to be generated to a first variable;

a step 2-1) of, when the first variable after the addition becomes greater than a result of addition of the first constant and a second constant indicating a ratio of the second frequency-divided signal included in the variable rate frequency-divided signal, outputting the first frequency-divided signal, subtracting the first constant and the second constant from the first variable, and returning to the step 1); and a step 2-2) of, when the first variable after the addition becomes smaller than a result of addition of the first constant and the second constant, outputting the second frequency-divided signal and returning to the process 1), thereby generating the variable rate frequency-divided signal in which the first frequency-divided signal and the second frequency-divided signal temporally alternately appear in a specified mixing ratio.

The method described above makes it possible to generate a variable rate frequency-divided signal in which frequency components of the first frequency-divided signal and frequency components of the second frequency-divided signal are mixed in a specified mixing ratio in a dispersed manner.

BRIEF DESCRIPTION OF THE DRAWINGS

FIG. 22 is a table showing the state of the variable rate frequency divider in operation.

DESCRIPTION OF EXEMPLARY EMBODIMENTS

Figure 1:
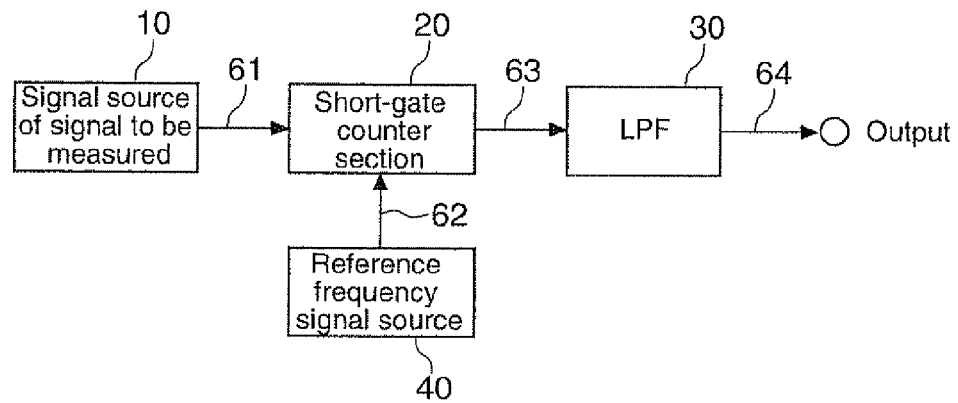
FIG. 1 is a diagram of an exemplary structure of a frequency measurement device.

Embodiments of the invention are concretely described below, according to the following composition, with reference to the accompanying drawings. It should be understood, however, that the following embodiments are merely examples of the invention, and do not limit the technological range of the invention. It is noted that identical parts in the drawings will be appended with the same reference numbers, and their description may be omitted if appropriate.

1. Definition
2. Summary of Frequency Measurement Device using Short-Gate Time Count Method
3. Description of noise generated by Short-Gate Time Count Method
4. Embodiment 1
   (1) Exemplary Structure of Frequency Measurement Device
   (2) Exemplary Structure of Variable Rate Frequency Divider
   (3) Exemplary Operation of Variable Rate Frequency Divider
   (4) Exemplary Operation of Frequency Measurement Device
5. Embodiment 2
   (1) Exemplary Structure of Frequency Measurement Device
   (2) Exemplary Structure of Variable Rate Frequency Divider
   (3) Exemplary Operation of Variable Rate Frequency Divider
6. Conclusion
7. Supplement 1. Definition First, terms used in this specification are defined as follows.

An "OO section" and an "OO circuit" (OO may be any arbitrary words)" include an electrical section and an electrical circuit without any particular limitation thereto, respectively, and may also include a physical mean that achieves the function of the circuit or the section or a functional mean that is realized by software, Also, the function of one circuit or one section may be each realized by two or more physical means or functional means, or the function of two or more circuits or sections may be realized by one physical mean or one functional mean.

2. Summary of Frequency Measurement Device that uses Short-Gate Time Count Method FIG. 1 is a diagram of an exemplary structure of a frequency measurement device in accordance with an embodiment of the invention. As shown in FIG. 1, the frequency measurement device is structured with a signal source of signal to be measured 10, a short gate counter section (also referred to as a "short-gate time counter section") 20, a low-pass filter (LPF) 30, and a reference frequency signal source 40.

Signal Source of Signal to be Measured 10

The signal source of signal to be measured 10 is structured to generate a signal to be measured 61 in a pulse stream. The signal source of signal to be measured (hereafter also referred to as a "pulse generator") 10 may be, for example, a quartz oscillator with an oscillation frequency f0 at 30 MHz, and corresponds to a detector section of an odor sensor, a gas sensor, a biosensor or the like. When odor substance or the like adheres to the quartz oscillator, its oscillation frequency lowers according to the amount of adhered substance. The signal to be measured 61 in a pulse stream is supplied to the short gate counter section 20.

Reference Frequency Signal Source 40

The reference frequency signal source 40 is structured to generate a reference frequency signal 62 that is a pulse stream signal having a frequency lower than that of the signal to be measured 61. In other words, the reference frequency signal 62 changes with a longer period than that of the signal to be measured 61. Hereafter, one period of the reference frequency signal 62 may be called a "gate time." The reference frequency signal source 40 is structured to frequency-divide a signal generated by, for example, an independent quartz oscillator different from the one used in the signal source of signal to be measured 10 by a specified frequency dividing ratio, thereby generating the reference frequency signal 62 at, for example, 100 Hz.

Short Gate Counter Section 20

The short gate counter section 20 is structured to continuously count the supplied pulse stream of the signal to be measured 61 with a relatively short gate time that is determined based on the reference frequency signal 62. More specifically, the short gate counter section 20 counts the number of changes in the signal to be measured 61 included within the gate time. For example, the short gate counter section 20 counts rising edges of the signal to be measured 61 that occur in one period from a rising edge to the next rising edge of the reference frequency signal 62. A counted value (hereafter also referred to as a "count value") 63 counted is sequentially supplied to the low-pass filter 30. As described below, the short gate counter section 20 may be structured to count changes in the signal to be measured 61 with an internal counter, and sample the count value by using the reference frequency signal 62. Accordingly, the frequency of the reference frequency signal 62 may be called a "sampling frequency," and one period of the reference frequency signal 62 may be called a "sampling period."

Low-pass Filter 30

The low-pass filter 30 is structured to remove high frequency components included in the inputted count result, and output only the low frequency components as an output signal 64.

First Exemplary Structure of Short Gate Counter Section 20

Figure 2:
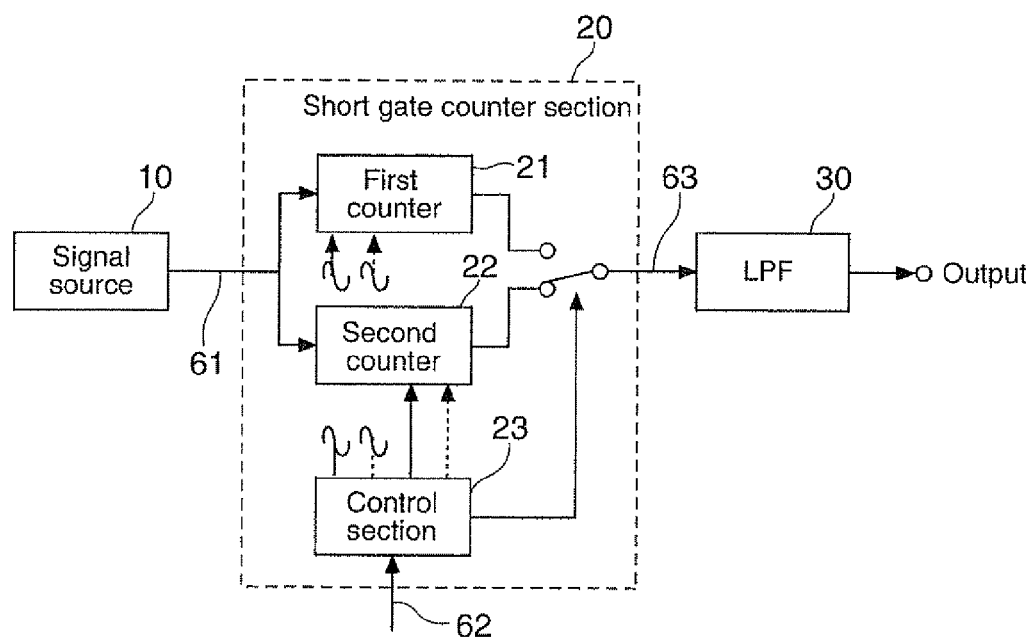
FIG. 2 is a diagram of a first exemplary structure of a short gate counter section.

FIG. 2 shows a first exemplary structure of the short gate counter section 20. The short gate counter section 20 is desired to count the pulse stream signal supplied from the signal source without interruption (without having an insensitive period for the inputted signal).

Accordingly, in accordance with the first exemplary structure, the short gate counter section 20 is provided with two counters, a first counter 21 and a second counter 22. The signal to be measured 61 is supplied to both of the first counter 21 and the second counter 22. A control section 23 transmits a gate signal and a reset signal to each of the first and second counters such that outputs from the both counters are supplied to the low-pass filter 30 through a switch. The switch is structured to select and output one of the output signals from the first counter 21 and the second counter 22, and may be composed of a physical switch or a logic circuit. The gate signal is a signal whose gate time is, for example, one period of the reference frequency signal 61, and the reference frequency signal 62 per se may be used as the gate signal. Measured values of the signal to be measured 61 are alternately outputted from the two counters, such that, while one of the counters is counting, the other counter performs resetting or transferring data, thereby avoiding an insensitive period that may be generated during resetting of the counter and transferring data. It is noted that the control section 23 may be implemented as hardware, but may also be implemented by software using a personal computer or the like.

Second Exemplary Structure of Short Gate Counter Section 20

Figure 3:
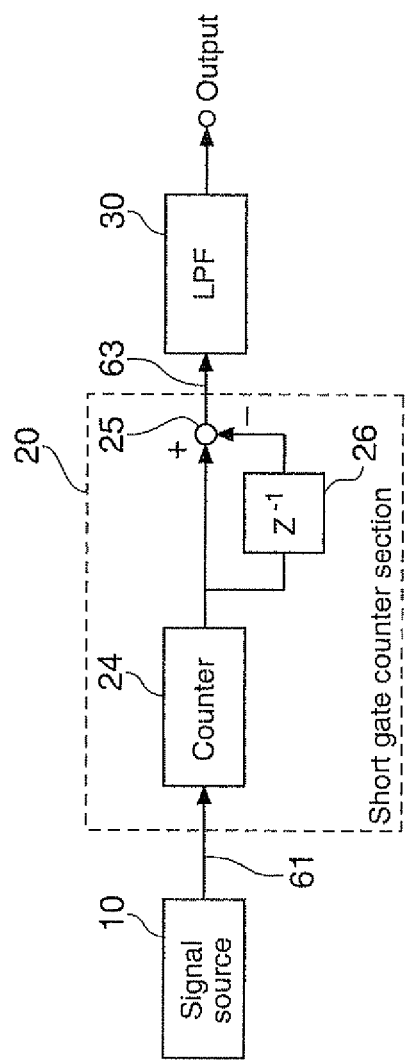
FIG. 3 is a diagram of a second exemplary structure of a short gate counter section.

FIG. 3 shows a second exemplary structure of the short gate counter section 20. This structure uses a single counter 24. The counter 24 is a counter using a direct count method, and always counts changes in the signal to be measured 61 supplied, and outputs their cumulative value. The cumulative count value that is an output of the counter 24 is supplied to a subtractor 25 and a register 26 that retains a previous cumulative count value. The subtractor 25 subtracts the previous cumulative count value obtained from the register 26 from the latest cumulative value outputted from the counter 24 to obtain a latest count value 63, and supplies the same to the low-pass filter 30.

First Exemplary Structure of Low-pass Filter 30

Figure 4:
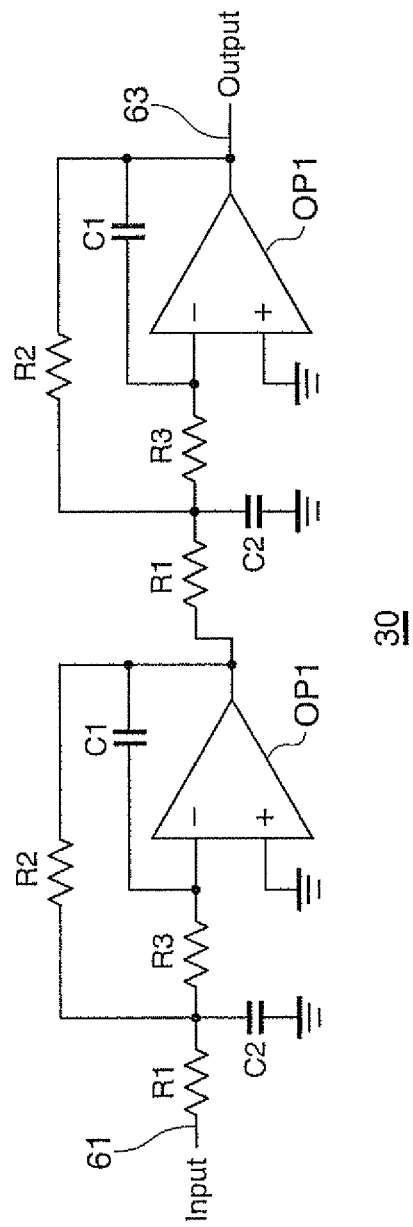
FIG. 4 is a diagram of an example of a low-pass filter structured with an analog circuit.

FIG. 4 shows an example in which the low-pass filter 30 is formed from an analog circuit. In this example, low-pass filters, each composed of resistors R1-R3, capacitors C1 and C2 and an operation amplifier OP1, are connected in two stages. Circuit constants of the constituent elements are suitably selected, whereby first frequency components or highband components above the first frequency are removed (suppressed) from the count value 63 that is an output signal of the short gate counter section 20 which has been converted into an analog signal with a D/A converter (not shown). The cut-off frequency and signal response characteristic of the low-pass filter are suitably set according to SIN (Signal/Noise) ratio of the output signal, waveform response characteristic of the output signal and the like. When the short gate counter 20 outputs the count value 63 in one-bit serial, the output can be inputted in the low-pass filter 30 as is. When the short gate counter 20 outputs data in n-bit, the data can be inputted through a D-A converter that accommodates the n-bit output.

Second Exemplary Structure of Low-pass Filter 30

Figure 5:
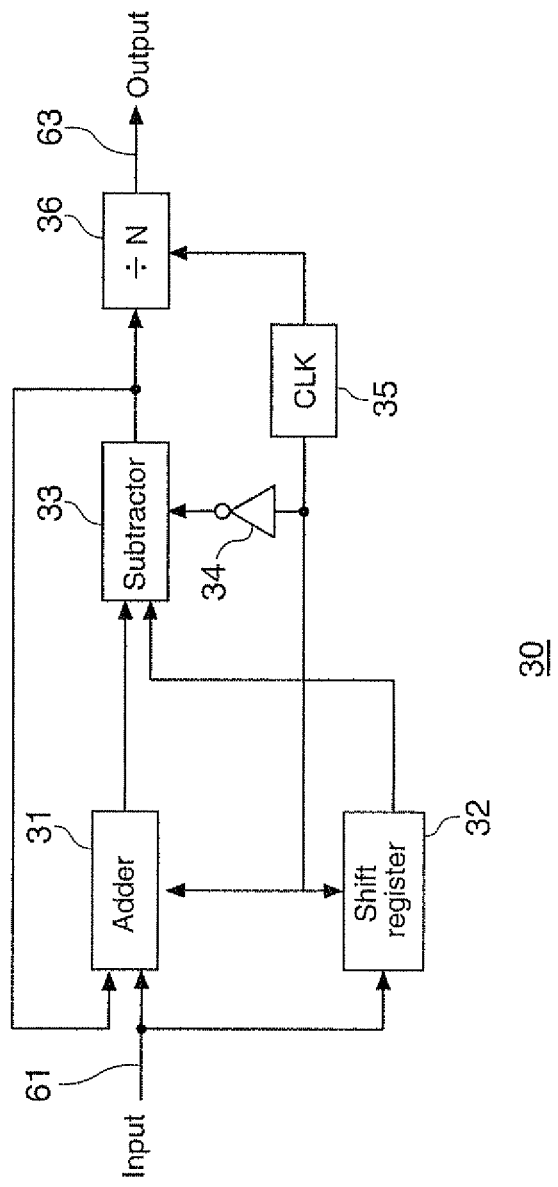
FIG. 5 is a diagram of an example of a low-pass filter structured with a moving average filter.

FIG. 5 shows an example in which the low-pass filter 30 is formed from a moving average filter that is one type of a digital filter. As shown in FIG. 5, the low-pass filter 30 has an adder 31, a shift register 32, a subtractor 33, an inverter 34, a control section 35 that supplies operation timing clocks to each of the sections, and a divider 36.

A count value 61 outputted from the short gate counter section 20 are supplied to both of the adder 31 and the shift register 32 that is equipped with storage regions corresponding to the tap number. N number of data that are subject to moving average value calculation sequentially move in synchronism with other data within the shift register 32. The total value obtained in a previous calculation is supplied to the other input of the adder 31, and the adder 31 adds the latest count value with the previous total value, thereby obtaining a cumulative added value. The counted value in the leading (old) data in the shift register 32 is removed from the cumulative added value by the subtractor 33, and the result is set as a latest total value. The latest total value is returned as a previous total value to the adder 31, and the latest total value is divided by the number of the subject data N by the divider 36. The calculation described above is performed for the entire data, whereby moving average values can be obtained. It is noted that the divider 36 has a function of scaling the output values, but such function may be omitted if the scaling is not of concern. Also, when the moving average filter is formed in multiple stages, the divider 36 may be provided only at the last stage. It is noted that the moving average filter can be composed of a digital circuit, and therefore is characterized by having a smaller circuit scale, compared to analog filters.

Figure 6:
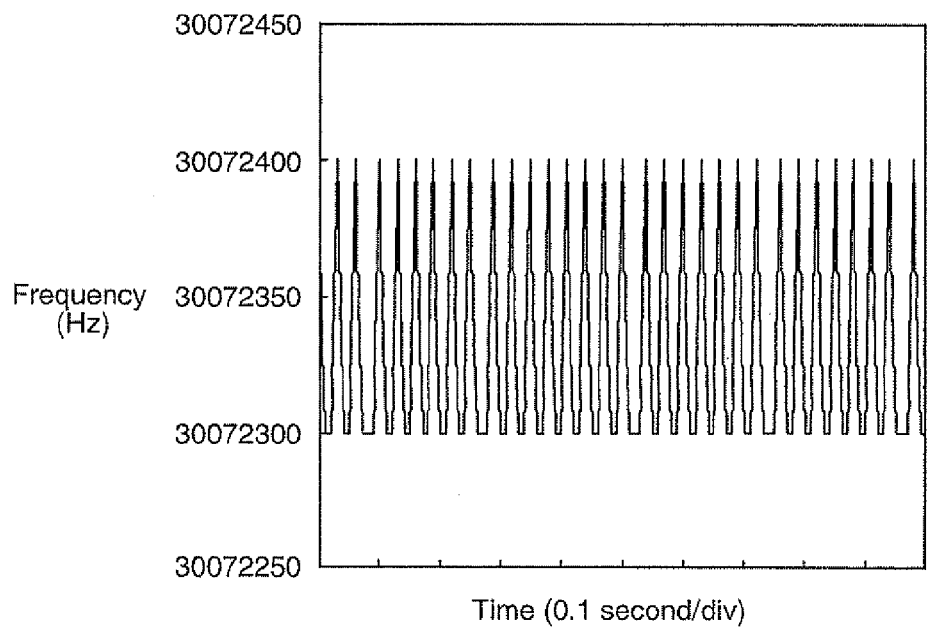
FIG. 6 is a graph showing an example of frequency measured with the passage of time.

FIG. 6 shows an example of frequency with the passage of time calculated based on the count value 63 counted by the short gate counter section 20. In this example, the number of changes in the signal to be measured 61 is counted with the sampling frequency of 100 Hz (the gate time being 0.01 sec). When the sampling frequency is 100 Hz, the frequency resolving power also lowers to 100 Hz, such that it is not possible to detect information lower than 100 Hz in the signal to be measured 61 from one count value 63, while 100 count values 63 can be obtained in one second. As shown in FIG. 6, the frequency that is presented as 100 times the count value is distributed in pulses along the time axis between 30,072,300 Hz and 30,072,400 Hz, which are mutually different by 100 Hz.

Here, the quantization error (±1 count error) in sampling is described. For example, the case where the frequency of a pulse stream signal that is stable at 123.34 Hz is measured by a counter of the direct count method is examined.

(A) When the gate time is 10 seconds: 1233 counts or 1234 counts at each 10 seconds are obtained.

The measurement value is obtained by multiplying the count value by 1/10, which is 123.3 Hz or 123.4 Hz (at each 10 seconds). (The measurement error is 0.1 Hz.)

(B) When the gate time is 1 second: 123 counts or 124 counts at each 1 second are obtained.

The measurement value is 123 Hz or 124 Hz (at each 1 second). (The measurement error is 1 Hz.)

(C) When the gate time is 0.1 second: 12 counts or 13 counts at each 0.1 second are obtained.

The measurement value is obtained by multiplying the count value by 10, which is 120 Hz or 130 Hz (at each 0.1 second). (The measurement error is 10 Hz.)

(D) When the gate time is 0.01 second: 1 count or 0 count at each 0.01 second is obtained.

The measurement value is obtained by multiplying the count value by 100, which is 100 Hz or 200 Hz (at each 0.01 second). (The measurement error is 100 Hz.)

When the signal to be measured 61 that is stable at one spot frequency is counted, like the examples (A)-(D), the counted values 63 are distributed in a pulse stream having an amplitude with a difference between two values that are determined by the gate time. On the other hand, even when the frequency of the signal to be measured 61 to be counted changes, if the changes are within the range of the measurement error described above, the counted values are likewise distributed in a pulse stream with an amplitude defined by a difference between two values. For example, in the case of (D) where the gate time is 0.01 second and the measurement error is 100 Hz, if changes in the frequency of the pulse stream signal to be counted are contained between 100 Hz and 200 Hz, a display of 100 Hz or 200 Hz can be obtained.

As shown in FIG. 6, in the method in which the number of changes in the signal to be measured 61 is counted with a short gate time that is less than one second (hereafter referred to as a "short-gate time count method"), the count value 63 changes into a pulse stream, and the occurrence of values in the count value changes according to changes in the frequency of the signal to be measured 61. The higher the frequency in the signal to be measured 61, the higher the occurrence of higher values in the pulse stream. In reverse, the lower the frequency in the signal to be measured 61, the higher the occurrence of appearance of lower values in the pulse stream. Information about the frequency of the signal to be measured 61 to be counted exists in low-band components of the frequency spectrum of the count values that behave as a pulse stream. Accordingly, the low-band components are extracted (harmonic components originating from quantization errors are removed) from the count values 63 by the low-pass filter, whereby the information about the changes, among the frequency of the signal to be measured 61 counted, can be decoded.

Figure 7:
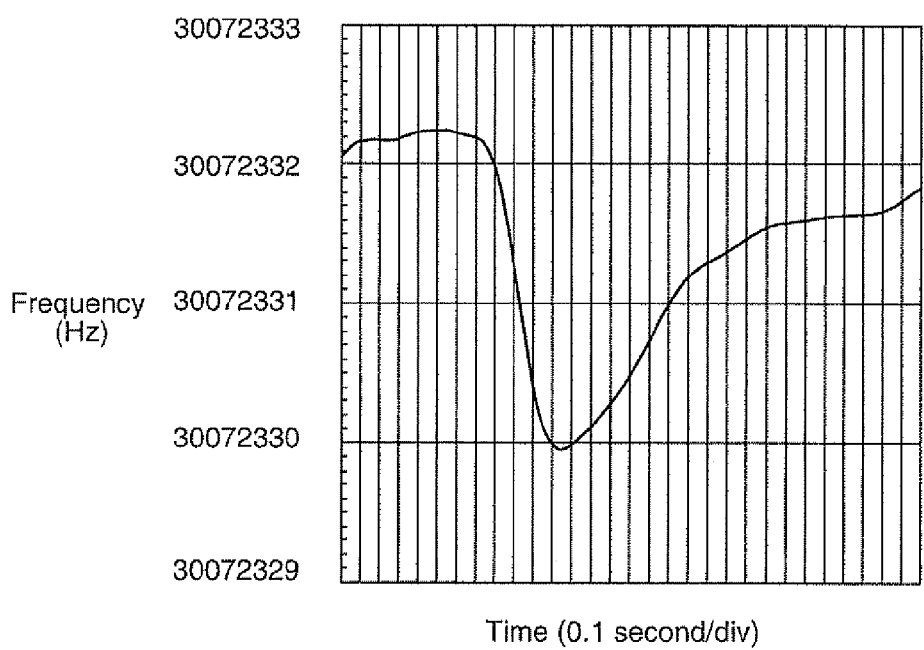
FIG. 7 is a graph showing an example in which high frequency components are removed from a signal stream of count values.

FIG. 7 shows an example in which high frequency components are removed by feeding the signal stream of the count values 63 described in FIG. 6 to the low-pass filter 30 with the tap number being 512. As shown in FIG. 7, the changes in the frequency of the signal to be measured 61 supplied are outputted as a continuous (analog) curve, It is observed that, by using the low-pass filter 30, it becomes possible to detect frequency changes in a region that cannot be measured due to quantization errors, in particular, frequency changes less than 1 Hz, in counting with a sampling period of 100 Hz.

In this manner, according to the short gate time count system, by shortening the gate time (making the sampling frequency higher), a stream of a plurality of measured values can be obtained even though the measurement error in each of the count values 63 becomes greater. By removing high frequency components by the low-pass filter 30 from the plurality of measured values, the frequency measurement resolving power is improved. As described above, the characteristic of the low-pass filter is suitably designed according to the required SIN ratio and signal response characteristic of the output signal. In other words, the circuit can be suppressed to a smaller scale by the short-gate time count method, such that multichannel implementation can be readily made. By using an analog low-pass filter, the present embodiment can also accommodate analog outputs, and other advantages can be obtained.

The short-gate time count method has various advantages described above. However, it has been found from the results of various experiments that noise may be generated (increased) depending on combinations of the frequency of the signal to be measured 61 outputted from the signal source of signal to be measured 10 and the sampling frequency. Noise generated in the short-gate time count method will be described with reference to FIGS. 8 to 19.

3. Description of Noise Generated in Short Gate Time Count Method

In the following description, the frequency measurement device shown in FIG. 1 is used to conduct experiments on generation of pattern noise. Here, the sampling frequency at the short gate counter section 20 is 100 Hz, and the low-pass filter 30 is structured with moving average filters serially connected in three stages, each with the tap number being 30.

Figure 8:
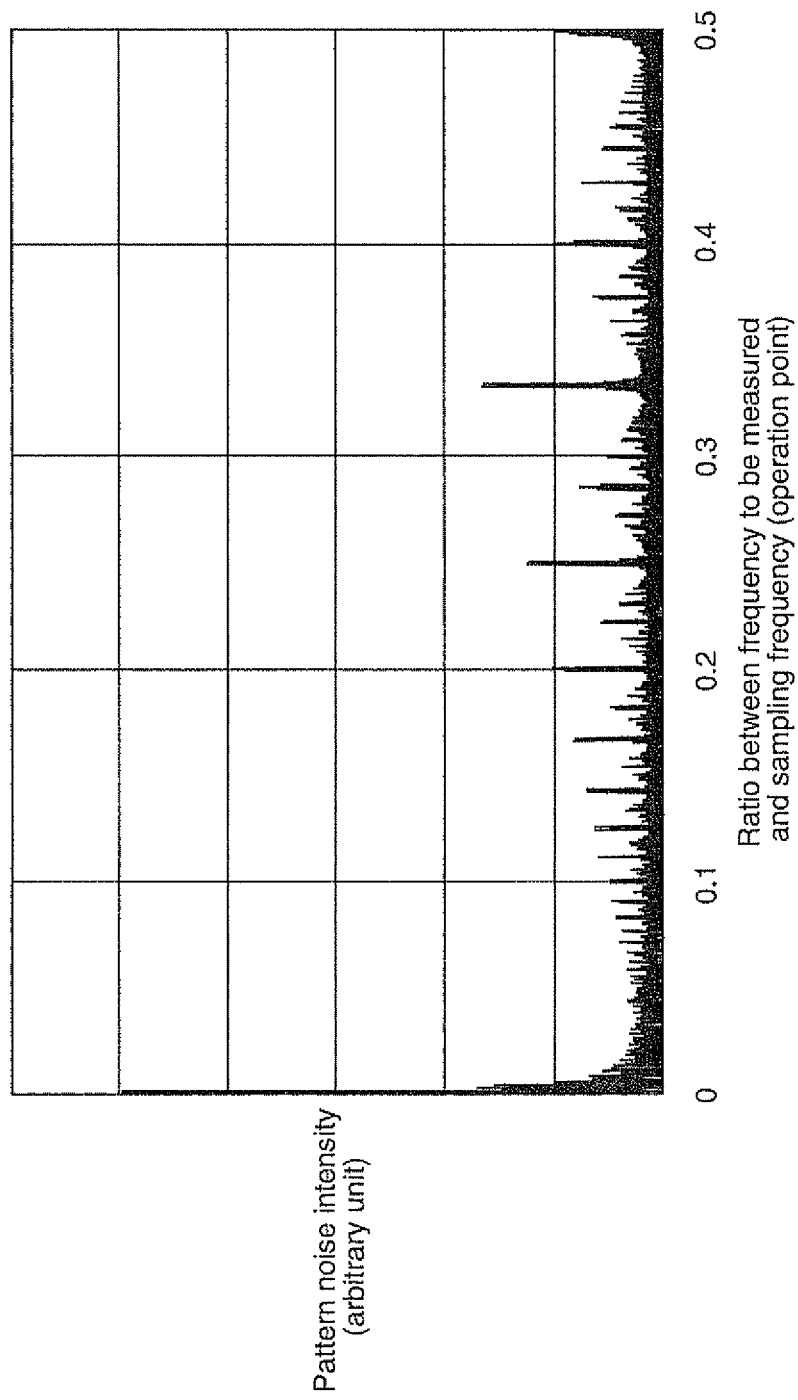
FIG. 8 is a graph showing pattern noise levels with respect to ratios between the frequency of a signal to be measured and the sampling frequency.

FIG. 8 is a graph showing pattern noise levels with respect to the ratio (the operating point parameter being 0-0.5) between the frequency of the signal to be measured 61 (hereafter also referred to as the "frequency to be measured") and the sampling frequency. The pattern noise levels are shown in relative values (in an arbitrary unit) with the maximum value being 1.

Operating point parameters are used for the convenience of understanding the characteristics, and may be defined as follows.

Operating point parameter=Frequency to be measured÷Sampling frequency−Int (Frequency to be measured÷Sampling frequency)

It is noted that Int (c) is a function indicating the integral part. By the definition given above, the operating point parameter indicates the fractional part of (Frequency to be measured÷Sampling frequency), and can be any value from 0 to less than 1. Pattern noise levels (intensities) are a complex function of the operating point parameters, and are symmetrical through the operating point parameter of 0.5. In other words, the pattern noise intensity at an operating point parameter of 0.5−d equals to the pattern noise intensity at an operating point parameter of 0.5+d (0<d≤0.5). Thus, in FIG. 8, the relation between noise intensities and operating points is shown in the range of operating point parameters between 0 and 0.5.

Figure 9:
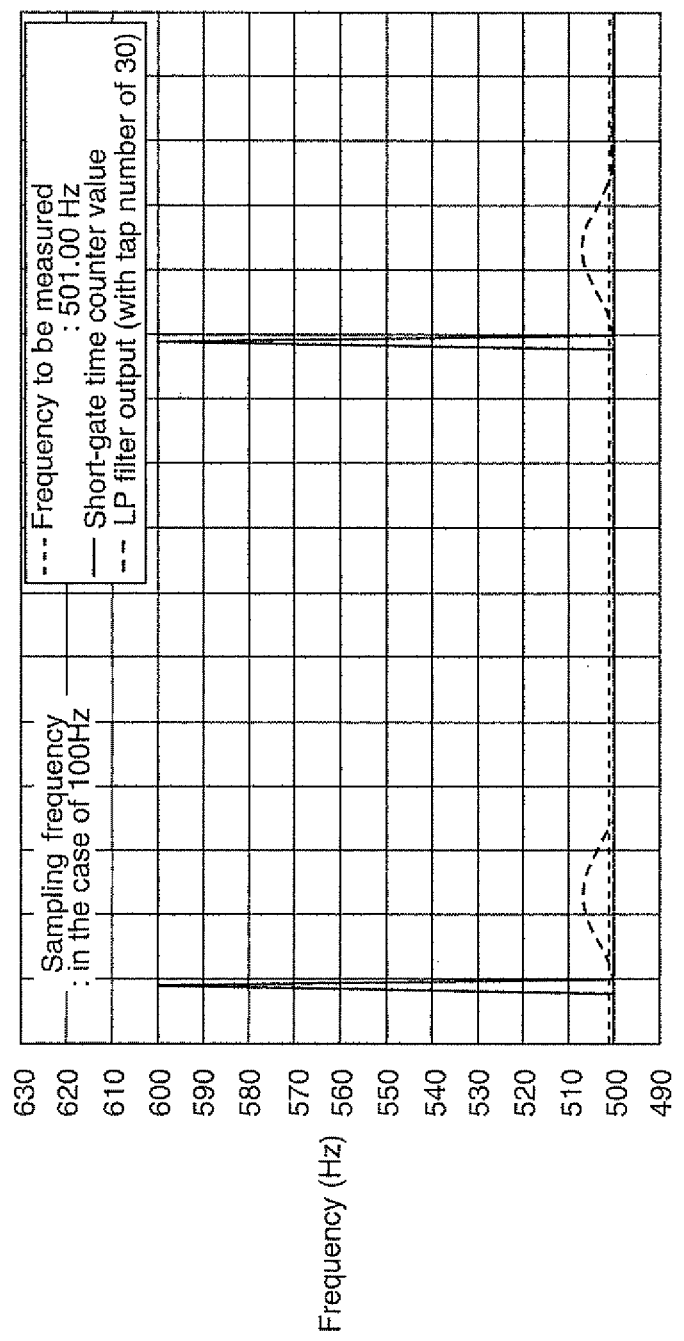
FIG. 9 is a graph showing changes in the frequency with time when the frequency to be measured is 501.00 Hz and the sampling frequency is 100 Hz.

FIG. 9 is a graph when the frequency to be measured is 501.00 Hz and the sampling frequency is 100 Hz. In this case, the operating point parameter obtained from the frequency to be measured and the sampling frequency is 0.01.In FIG. 9, the axis of abscissas indicates the time, the axis of ordinates indicates the frequency, the solid line indicates short-gate time count values, the short-dot line indicates frequencies to be measured, and the long-dot line indicates outputs of the low-pass filter 30 (which are similarly defined in the following figures up to FIG. 17). The frequency to be measured is at a constant value, but it is observed that changes periodically appear in the output of the low-pass filter 30 (at constant intervals along the time axis), generating pattern noise.

Figure 10:
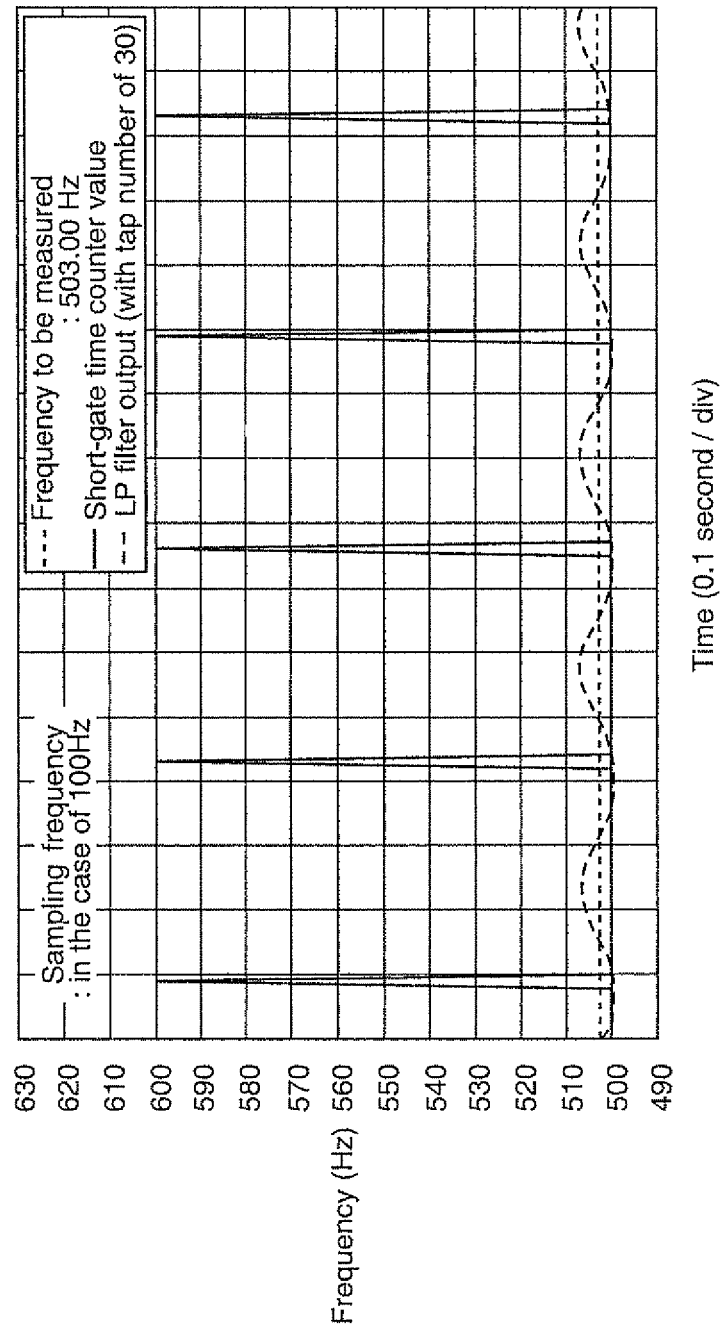
FIG. 10 is a graph showing changes in the frequency with time when the frequency to be measured is 503.00 Hz and the sampling frequency is 100 Hz.

FIG. 10 similarly shows a graph when the frequency to be measured is 503.00 Hz, the sampling frequency is 100 Hz, and the operating point parameter becomes to be 0.03. Continuous frequency changes appear in the output of the low-pass filter 30 and pattern noise is continuously generated.

Figure 11:
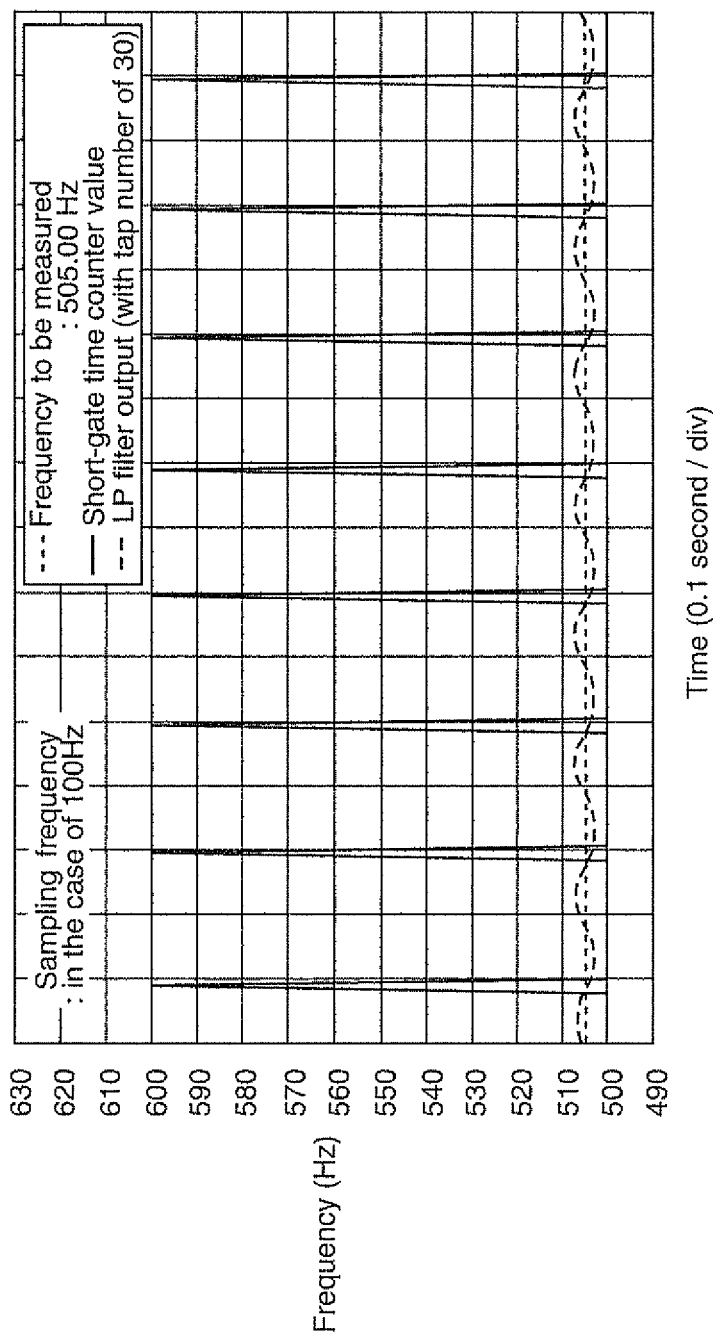
FIG. 11 is a graph showing changes in the frequency with time when the frequency to be measured is 505.00 Hz and the sampling frequency is 100 Hz.

FIG. 11 shows a graph when the frequency to be measured is 505.00 Hz, the sampling frequency is 100 Hz, and the operating point parameter becomes to be 0.05. Patten noise is continuously generated in the output of the low-pass filter 30, but the amplitude of the pattern noise is reduced, compared to the case with the operating point parameter being 0.03 shown in FIG. 10.

Figure 12:
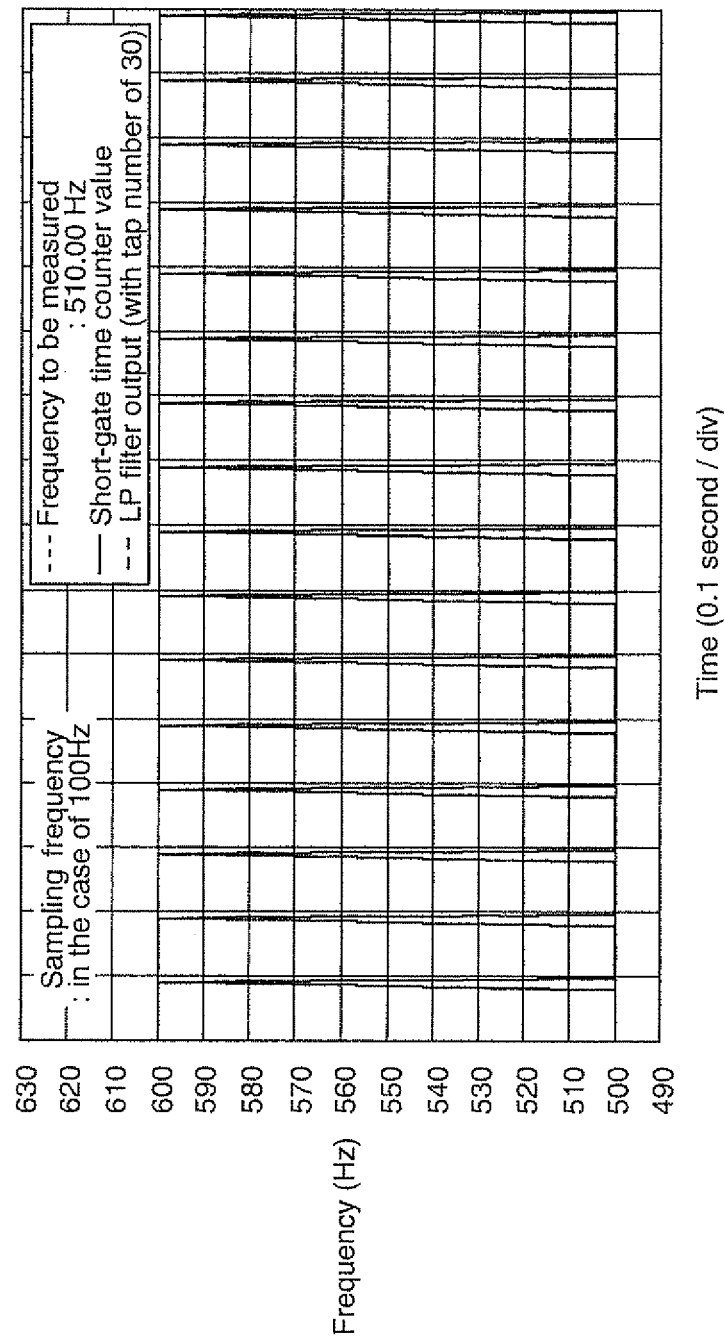
FIG. 12 is a graph showing changes in the frequency with time when the frequency to be measured is 510.00 Hz and the sampling frequency is 100 Hz.

FIG. 12 shows a graph when the frequency to be measured is 510.00 Hz, the sampling frequency is 100 Hz, and the operating point parameter becomes to be 0.10. The output of the low-pass filter 30 becomes to be equal to the frequency to be measured, such that no pattern noise is generated.

Figure 13:
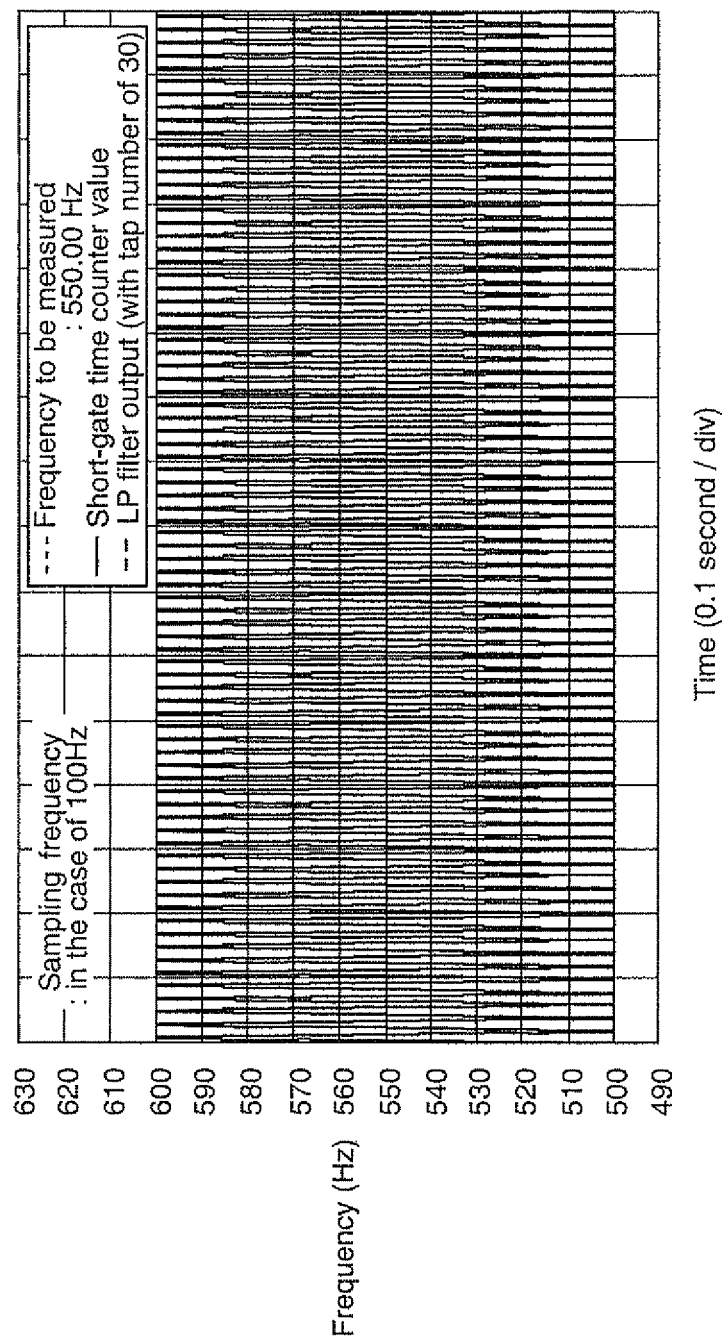
FIG. 13 is a graph showing changes in the frequency with time when the frequency to be measured is 550.00 Hz and the sampling frequency is 100 Hz.

FIG. 13 shows a graph when the frequency to be measured is 550.00 Hz, the sampling frequency is 100 Hz, and the operating point parameter becomes to be 0.50. The output of the low-pass filter 30 becomes to be equal to the frequency to be measured, such that no pattern noise is generated.

Figure 14:
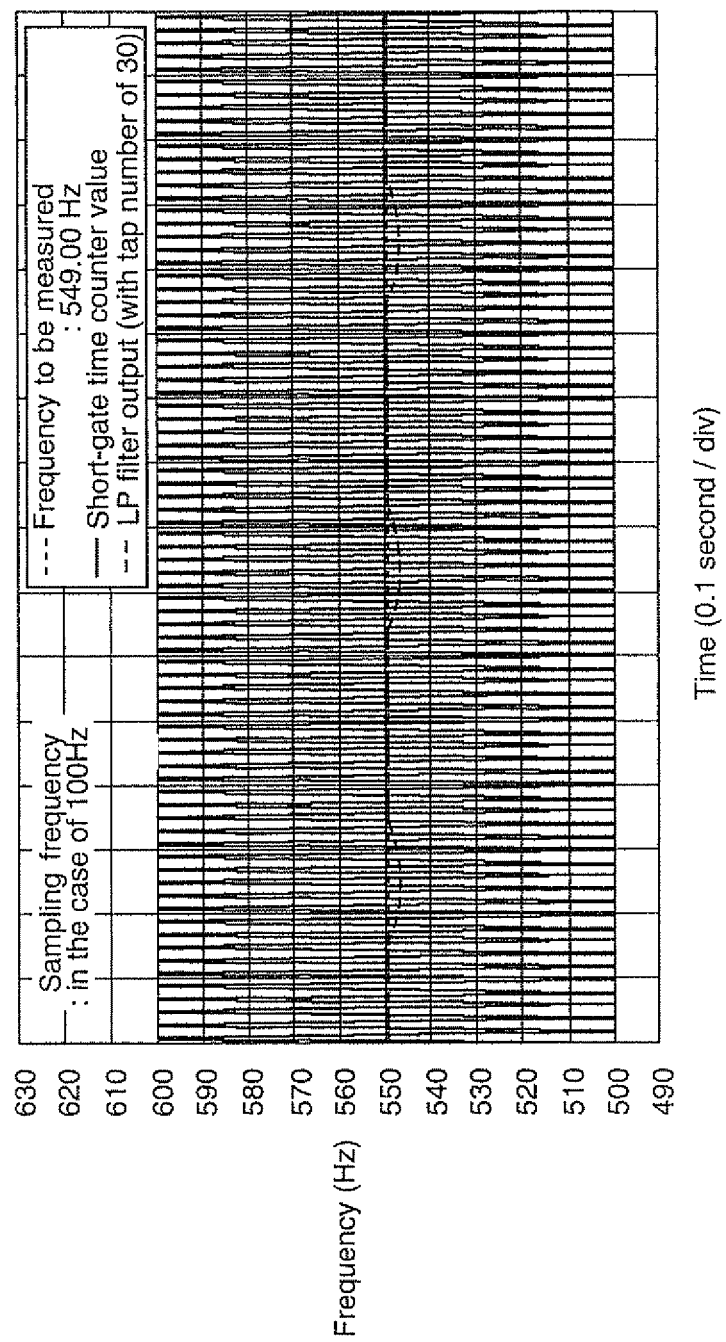
FIG. 14 is a graph showing changes in the frequency with time when the frequency to be measured is 549.00 Hz and the sampling frequency is 100 Hz.

FIG. 14 shows a graph when the frequency to be measured is 549.00 Hz, the sampling frequency is 100 Hz, and the operating point parameter becomes to be 0.49. Frequency changes periodically appear in the output of the low-pass filter 30, and it is therefore understood that pattern noise is generated.

Figure 15:
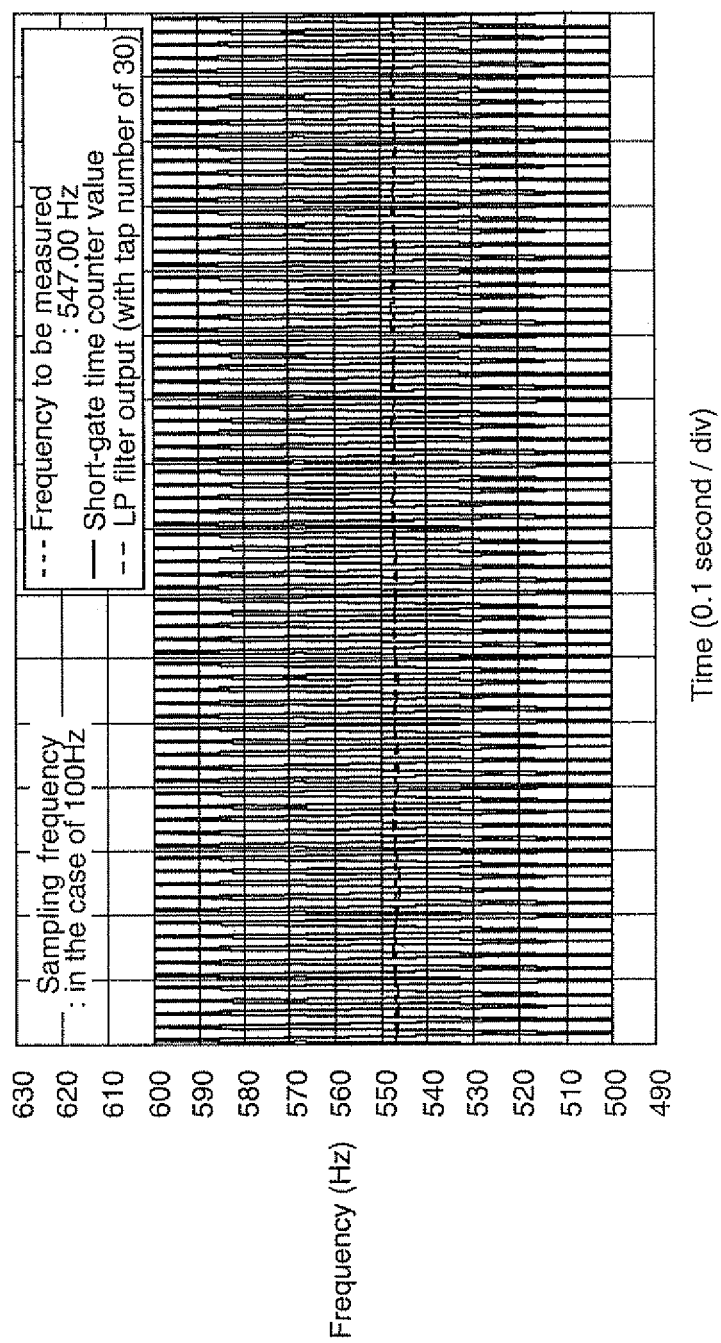
FIG. 15 is a graph showing changes in the frequency with time when the frequency to be measured is 547.00 Hz and the sampling frequency is 100 Hz.

FIG. 15 shows a graph when the frequency to be measured is 547.00 Hz, the sampling frequency is 100 Hz, and the operating point parameter becomes to be 0.47. Frequency changes in small amplitude appear in the output of the low-pass filter 30, and it is therefore understood that pattern noise is generated.

Figure 16:
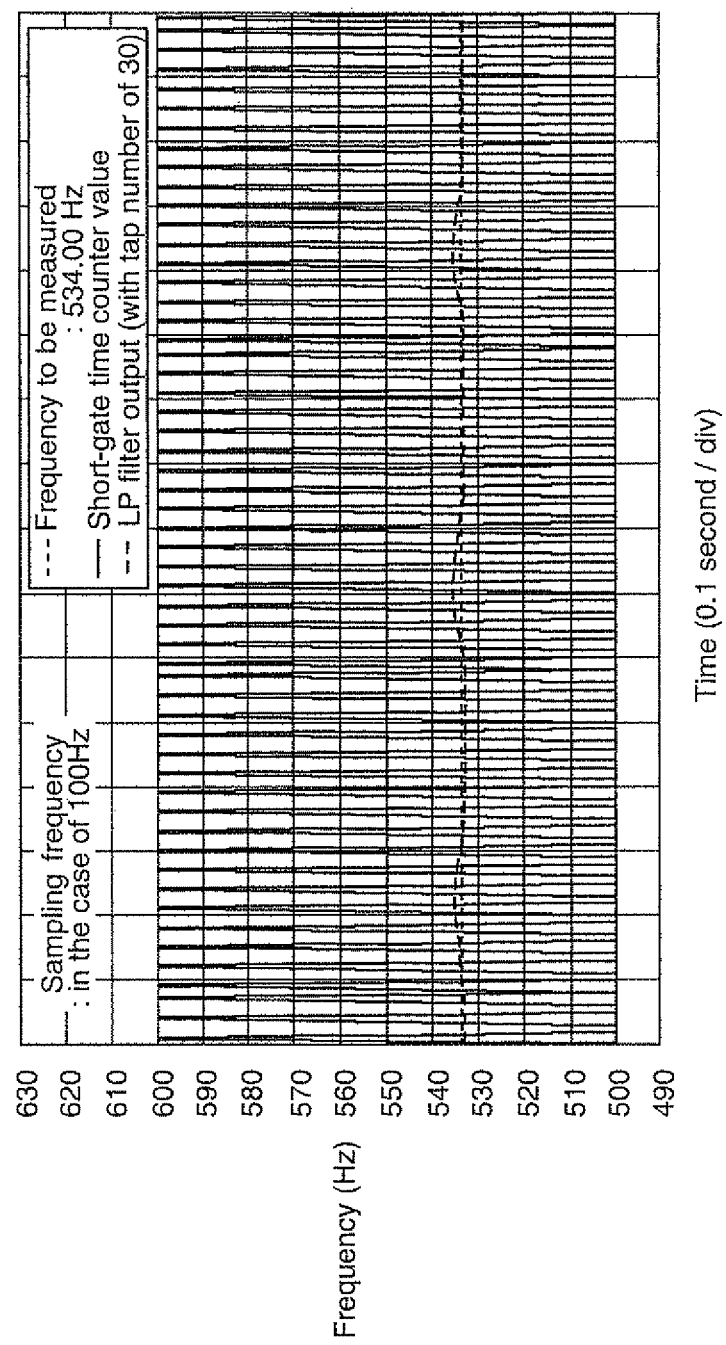
FIG. 16 is a graph showing changes in the frequency with time when the frequency to be measured is 534.00 Hz and the sampling frequency is 100 Hz.

FIG. 16 shows a graph when the frequency to be measured is 534.00 Hz, the sampling frequency is 100 Hz, and the operating point parameter becomes to be 0.34. Periodical frequency changes appear in the output of the low-pass filter 30, and it is therefore understood that pattern noise is present.

Figure 17:
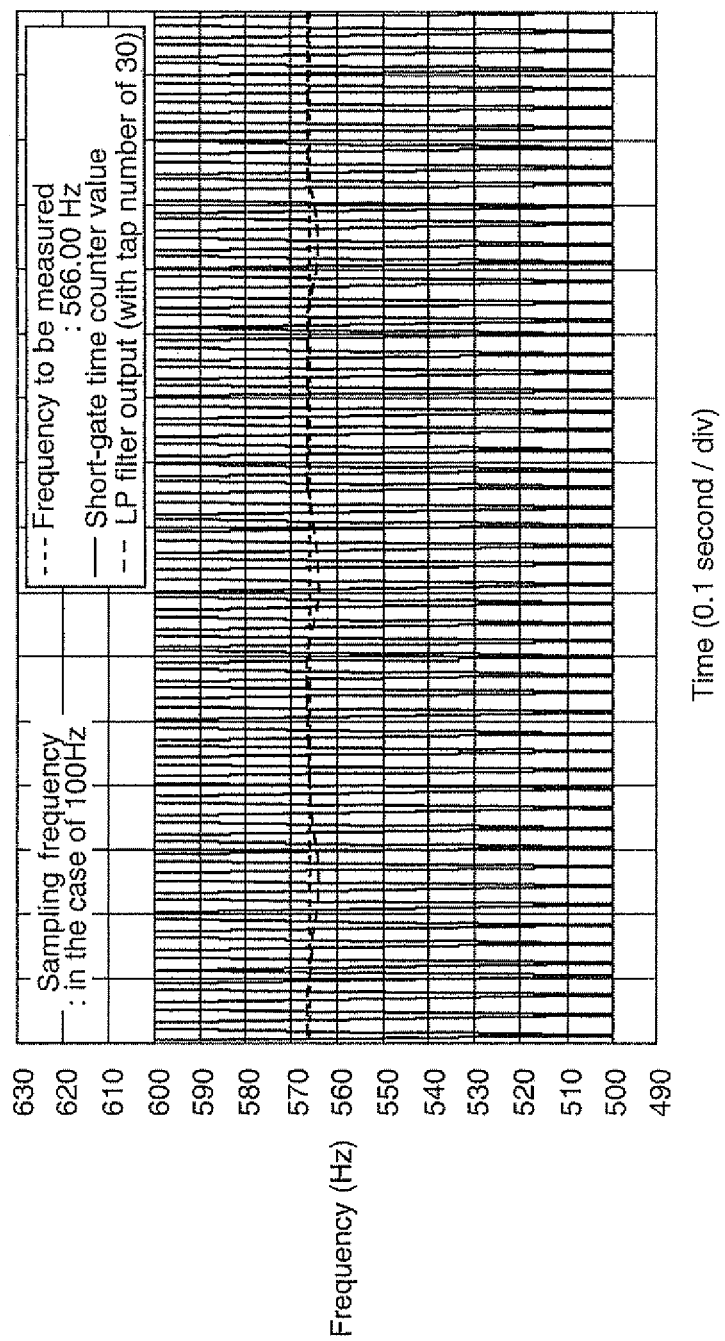
FIG. 17 is a graph showing changes in the frequency with time when the frequency to be measured is 566.00 Hz and the sampling frequency is 100 Hz.

FIG. 17 shows a graph when the frequency to be measured is 566.00 Hz, the sampling frequency is 100 Hz, and the operating point parameter becomes to be 0.66 (=0.34). Periodical frequency changes appear in the output of the low-pass filter 30, and it is therefore understood that pattern noise is generated. Compared to the case where the operating point parameter becomes to be 0.34 as shown in FIG. 16, it is noted that the amplitude of the frequency changes is the same, but tendencies of increase and decrease in the frequency changes are reversed.

Figure 18:
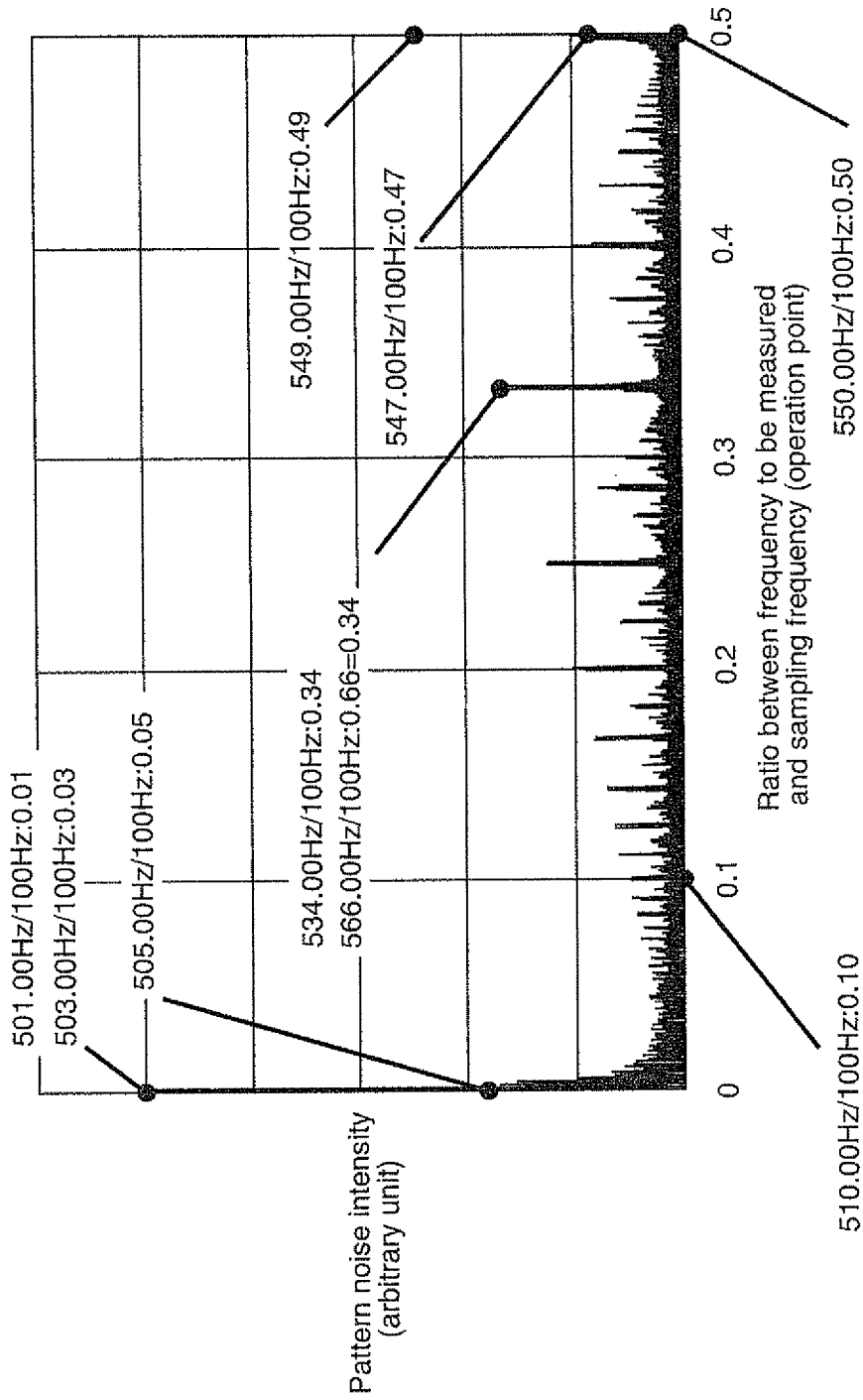
FIG. 18 is a graph in which pattern noise levels corresponding to operating point parameters are added.

FIG. 18 is a graph in which pattern noise levels corresponding to the operating point parameters shown in FIGS. 9 through 17 described above are added in the graph of FIG. 8.

Among the group of the operating point parameters of 0.01, 0.03 and 0.05 which are neighborhood values of the operating point parameter of 0.0 (that corresponds to 1.0), the closer to the operating point parameter of 0.0, the greater the pattern noise level becomes.

Although the graph of FIG. 18 does not clearly show, pattern noise levels are zero (0) at positions on the axis of abscissas which are expressed by simple rational numbers (for example, 1/1–1/10), such as, at 1.0 (=1/1), 0.5 (=1/2), 0.33 . . . (=1/3), 0.25(=1/4), 0.2(=1/5), 0.66 . . . (=2/3), 0.1 (=1/10), and the like. For example, in the examples shown in FIG. 12 and FIG. 13, the operating point parameters coincide with simple rational numbers (1/10, 1/2), such that no pattern noise is generated.

At the operating point parameters of 0.49 (see FIGS. 14) and 0.47 (see FIG. 15) which are in neighborhood of the operating point parameter of 0.5 but are off from simple rational numbers, noise levels are relatively high, but pattern noise levels are relatively low, compared to those in close neighborhood of the operating point parameter of 0.0.

With respect to the operating point parameter of 0.34 (see FIG. 16) and the operating point parameter of 0.66 (see FIG. 17), the dependencies of pattern noise levels on these operating point parameters are in symmetrical positional relation through 0.50 as a reference.

By defining ratios between frequencies to be measured and sampling frequencies as operation point parameters, as described above, pattern noise levels derived from combinations of the frequencies to be measured and the sampling frequencies can be grasped. Then, by prohibiting the use of any combinations between the frequencies to be measured and the sampling frequencies whose operation point parameters are in neighborhood of simple rational numbers, pattern noise can be suppressed.

4. Embodiment Example 1

Hereinbelow, referring to FIGS. 19 through 26, Embodiment 1 in accordance with an embodiment of the invention will be described.

(1) Exemplary Structure of Frequency Measurement Device

Figure 19:
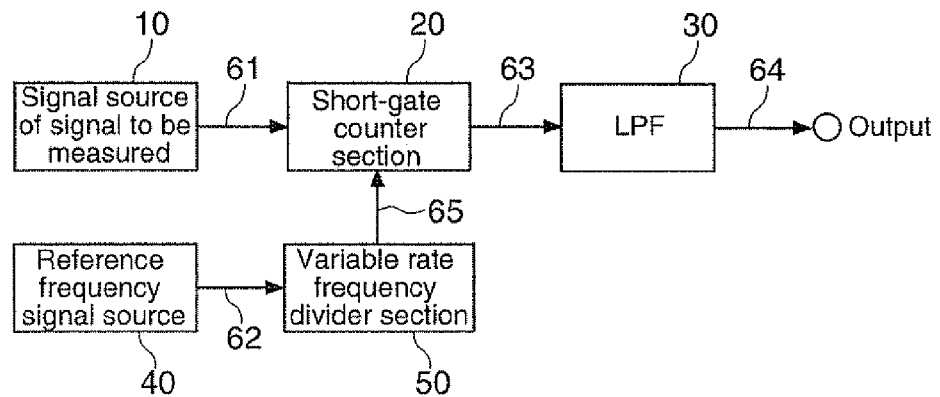
FIG. 19 is a diagram of a first exemplary structure of a frequency measurement device equipped with a variable rate frequency divider.

FIG. 19 is a diagram of a first exemplary structure of a frequency measurement device equipped with a variable rate frequency divider section 50. As shown in FIG. 19, the frequency measurement device is structured with a signal source of signal to be measured 10, a reference frequency signal source 40, a variable rate frequency divider section 50, a short gate counter section 20, and a low-pass filter 30. It is noted here that the signal source of signal to be measured 10, the short gate counter section 20 and the low-pass filter 30 have basically the same structure and function as those of the frequency measurement device described above with reference to FIG. 1, and therefore their description is omitted.

Reference Frequency Signal Source 40

The reference frequency signal source 40 is structured to generate a reference frequency signal 62, as described above. Unlike the frequency measurement device described in FIG. 1, the reference frequency signal 62 that is an output of the reference frequency signal source 40 is not directly supplied to the short gate counter section 20, but supplied first to the variable rate frequency divider section 50. Also, the reference frequency signal 62 that is generated and supplied by the reference frequency signal source 40 does not necessary to be a signal having a frequency lower than that of the signal to be measured 61, and can be set at an arbitrary level.

Variable Rate Frequency Divider Section 50

The variable rate frequency divider section 50 is structured to generate a variable rate frequency-divided signal 65 based on the reference frequency signal 62 and supply the same to the short gate counter section 20. The variable rate frequency divider section 50 is concretely described below.

(2) Exemplary Structure of Variable Rate Frequency Divider Section

Figure 20:
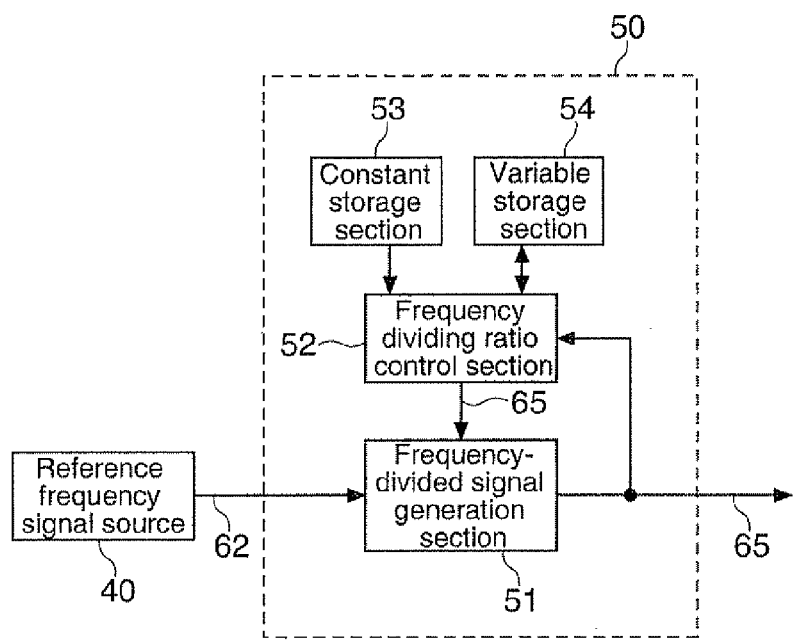
FIG. 20 is a diagram of a first concrete exemplary structure of a variable rate frequency divider in the frequency measurement device.

FIG. 20 is a diagram showing a first concrete exemplary structure of the variable rate frequency divider section 50 of the frequency measurement device. As shown in FIG. 20, the variable rate frequency divider section 50 is structured with a frequency-divided signal generation section 51, a frequency dividing ratio control section 52, a constant storage section 53, a variable storage section 54. The variable rate frequency divider section 50 generates the variable rate frequency-divided signal 65 based on the reference frequency signal 62 supplied from the reference frequency signal source 40.

Frequency-Divided Signal Generation Section 51

The frequency-divided signal generation section 51 generates a first frequency-divided signal (frequency-divided signal a) obtained by frequency-dividing the reference frequency signal 62 by a first frequency dividing ratio (natural number a), and a second frequency-divided signal (frequency-divided signal b) obtained by frequency-diving the reference frequency signal 62 by a second frequency dividing ratio (natural number b). Then, by the control of the frequency dividing ratio control section 52, the frequency-divided signal generation section 51 mixes the frequency-divided signal a and the frequency-divided signal b at a mixing ratio of α:β, thereby generating the variable rate frequency-divided signal 65 in which the frequency-divided signal a and the frequency-divided signal b temporally alternately appear.

Frequency Dividing Ratio Control Section 52

The frequency dividing ratio control section 52 obtains the constants α and β from the constant storage section 53 that is structured to be capable of storing constants, and obtains a variable c from the variable storage section 54 that is structured to be capable of storing variables. The frequency dividing ratio control section 52 uses the constants α and β and the variable c to control the frequency-divided signal generation section 51 to generate the variable rate frequency-divided signal 65.

(3) Operation Example of Variable Rate Frequency Divider Section

Figure 21:
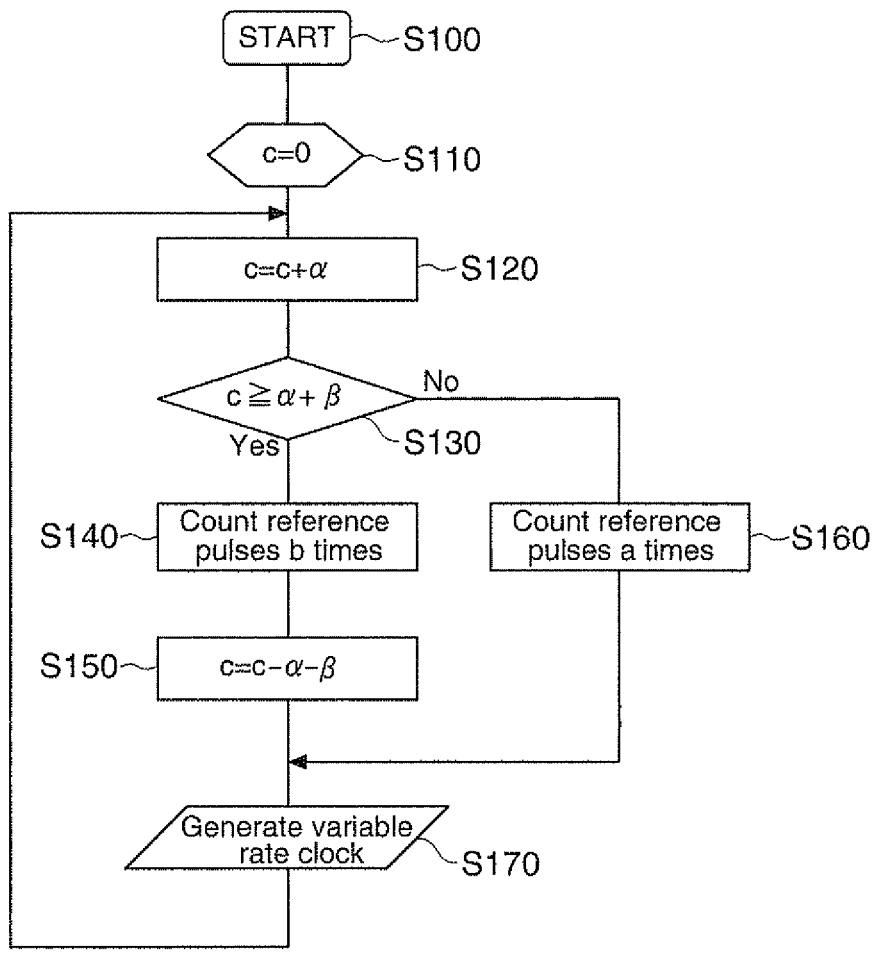
FIG. 21 is a flow chart showing an exemplary operation of the variable rate frequency divider.

Operation of the variable rate frequency divider section 50 will be described below with reference to FIGS. 21 through 23. FIG. 21 is a flow chart representing an example of operations of the variable rate frequency divider section 50. FIG. 22 is a table showing the state of the variable rate frequency divider section 50 during operation. The example will be described with the frequency dividing ratio a=2, the frequency dividing ratio b=3, the constant α=4, and the constant β=12, for the sake of simplicity of the description. It is noted that the variable rate frequency-divided signal 65 may be called a variable rate clock, and the reference frequency signal 62 may be called a reference pulse.

S100-S110

The variable rate frequency divider section 50 first initializes the variable c stored in the variable storage section 54 (S110), after the operation is started (S100)(see No. 1 in FIG. 22).

S120

Then, the variable rate frequency divider section 50 acquires a constant α (4) indicating the ratio of the frequency-divided signal a (a divide-by-2 frequency-divided signal) to be included in a variable rate frequency-divided signal 65 to be generated, and adds the constant a to the variable c of the variable storage section 54 (S120). Accordingly, the variable c becomes to be 0+4=4(see No. 2 in FIG. 22).

S130

Next, the variable rate frequency divider section 50 compares the result of addition of the constant α (4) and the constant β (12) of the constant storage section 53 (4 +12 =16) with the variable c (4) of the variable storage section 54 (S130).

S160-S170

At this time, as the variable c (4) is smaller than α+β (16), the variable rate frequency divider section 50 counts the reference pulse a two (2) times (S160), thereby generating a clock (S170). Here, counting the reference pulse n times means to generate a variable rate clock whose one period is n times the period of the reference pulse. FIG. 22 shows the variable rate clock being either 1 or 0. No. 1 and No. 2 in FIG. 22 noted with "divide-by-2" indicate 1 and 0, respectively, and then No. 3 indicates 1. In other words, the variable rate clock is a signal whose one period equals to a period that is two times that of the reference pulse. When the process up to this step is completed, the process returns to S120, and repeats a series of the steps.

S120

At the time when the series of the steps has been repeated three times (at the time of No. 6 in FIG. 22), the variable c has become to be 12. Here, as the variable rate frequency divider section 50 adds the constant a α (4) to the variable c (12) (8120), the result of addition becomes to be (12+4)=16.

S130-S140

The result of addition "16" is 16 or above that is the result of addition of the constant α (4) +the constant β (12) (8130), such that the variable rate frequency divider section 50 counts the reference pulse b three (3) times (8140) (see Nos. 7-9 in FIG. 22).

S150-S170

At this time, the constant a and the constant 13 are subtracted from the variable c (S150) (see No. 8 in FIG. 22). As describe above, when the reference pulse is counted three times, the variable rate clock becomes to be 1, 0, 0 as indicated at Nos. 7 through 9 in FIG. 22, which define a signal having a period three times that of the reference pulse. It is noted that the variable rate clock is presented as 1, 0, 0, but it can be, for example, 1, 1, 0, as long as the period of the signal is maintained. Then, by the counting of the reference pulse in S140, the variable rate clock is generated (S170), It is noted that a control signal in FIG. 22 is a flag that changes when the relation of c≥α+β is established, and a 1 bit counter is a 1-bit counter value that counts changes in the reference frequency signal 62.

Figure 23:
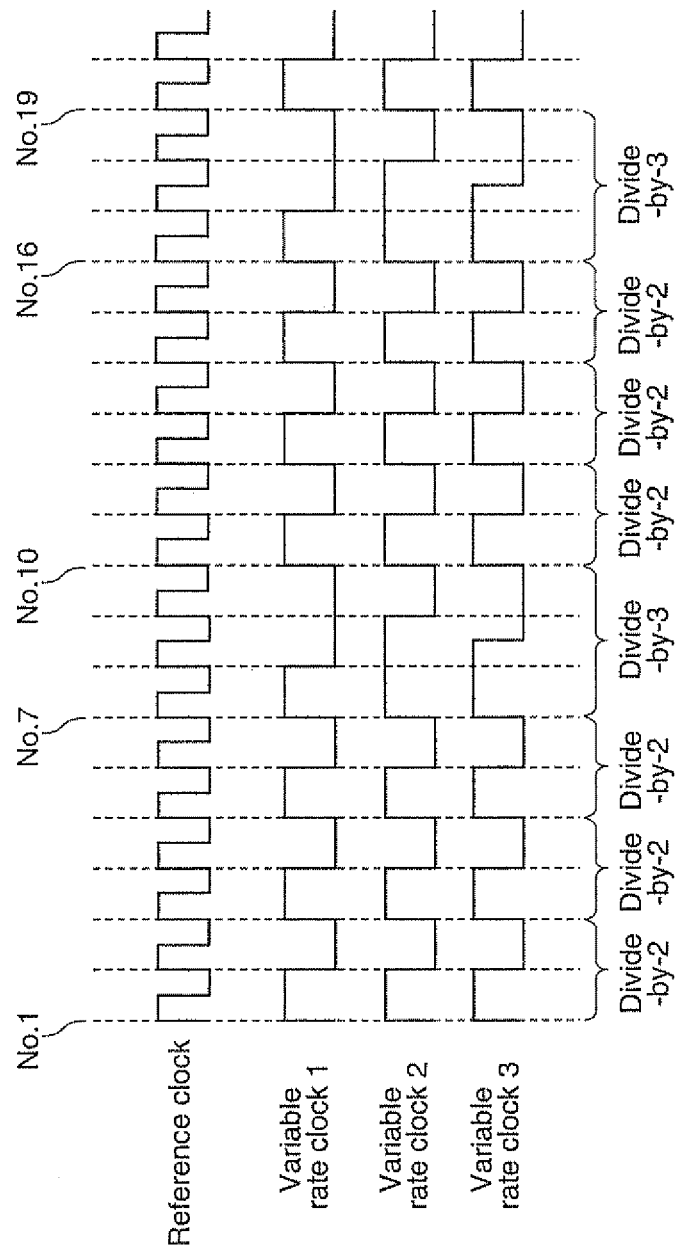
FIG. 23 is a chart showing an example of variable rate clocks generated.

FIG. 23 shows examples of variable rate clocks generated, as described above. In FIG. 23, the variable rate clocks 1 through 3 are each a variable rate clock that mixes the divide-by-2 frequency-divided signal and the divide-by-3 frequency-divided signal of the reference clock at a mixing ratio of 3: 1 (=12:4). However, the duty of the divide-by-3 frequency-divided signal mixed in each of the variable rate clocks 1 through 3 is different from one another. The example above is described using the variable rate clock 1 as an example, but variable rate clocks whose duty of the divide-by-3 frequency-divided signal is different, such as, the variable rate clocks 2 and 3 are also included in the scope of the invention.

(4) Operation Example of Frequency Measurement Device

Next, an example of operation of the frequency measurement device in accordance with an embodiment of the invention will be described. In this example, an oscillation circuit including a quartz oscillator that vibrates at 30012391 Hz is used as the reference frequency signal source 40, and an oscillation circuit including a quartz oscillator that vibrates at 30105831 Hz is used as the signal source of signal to be measured 10. The variable rate frequency divider section 50 mixes signals obtained by frequency-dividing the reference frequency signal 62 by 16385 and 16386 at a mixing ratio of 2:3, thereby generating the variable rate frequency-divided signal 65. The frequency of the signal to be measured 61 increases by several Hz from 30105831 Hz. In this condition, for comparison, the divide-by-16385 frequency-divided signal, the divide-by-16386 frequency-divided signal and the variable rate frequency-divided signal 65 described above are each supplied to the short gate counter section 20, and changes in the frequency of the signal to be measured 61 are measured.

Figure 24:
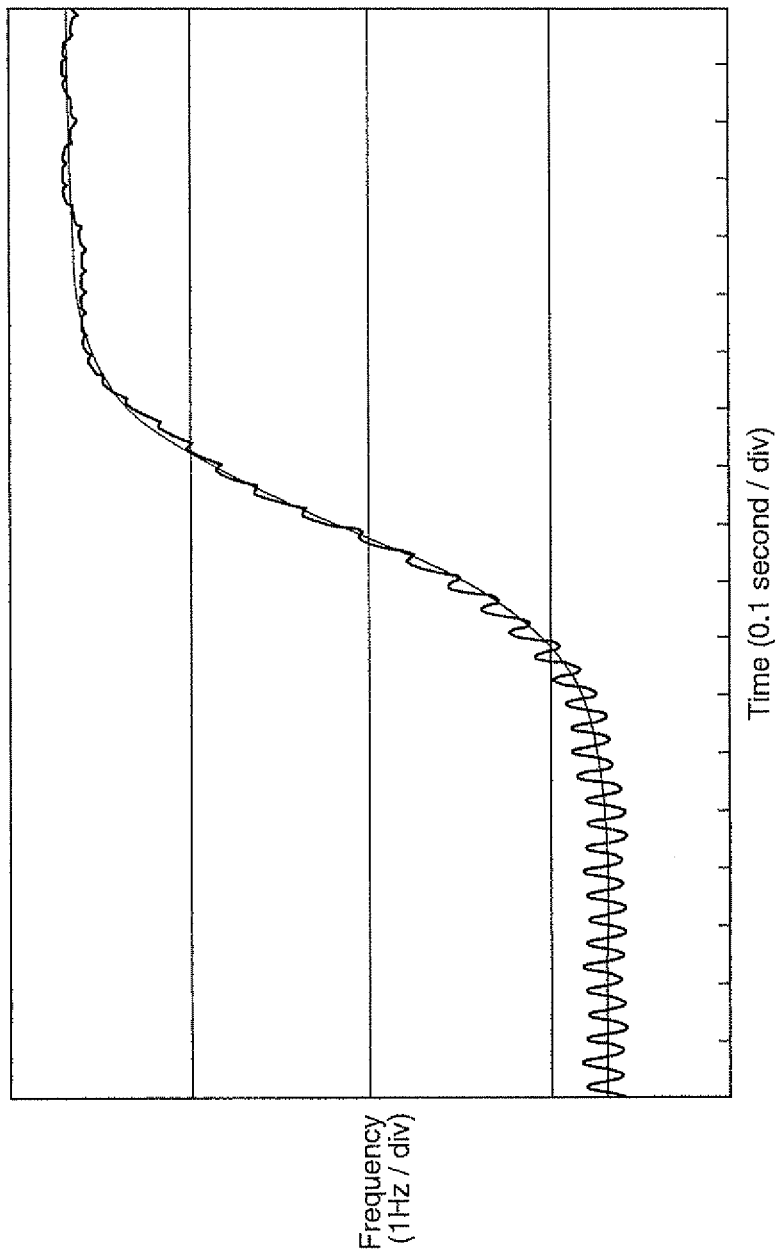
FIG. 24 is a graph showing temporal changes in the frequency of a signal to be measured, measured with a 16385-frequency-divided signal.

FIG. 24 is a graph showing temporal changes in the frequency of the signal to be measured 61, measured by using the divide-by-16385 frequency-divided signal. FIG. 24 also plots temporal changes in the actual frequency of the signal to be measured 61. As shown in FIG. 24, the measured frequency has noise superposed on the actual frequency in the first half of the measuring period. This noise is pattern noise.

Figure 25:
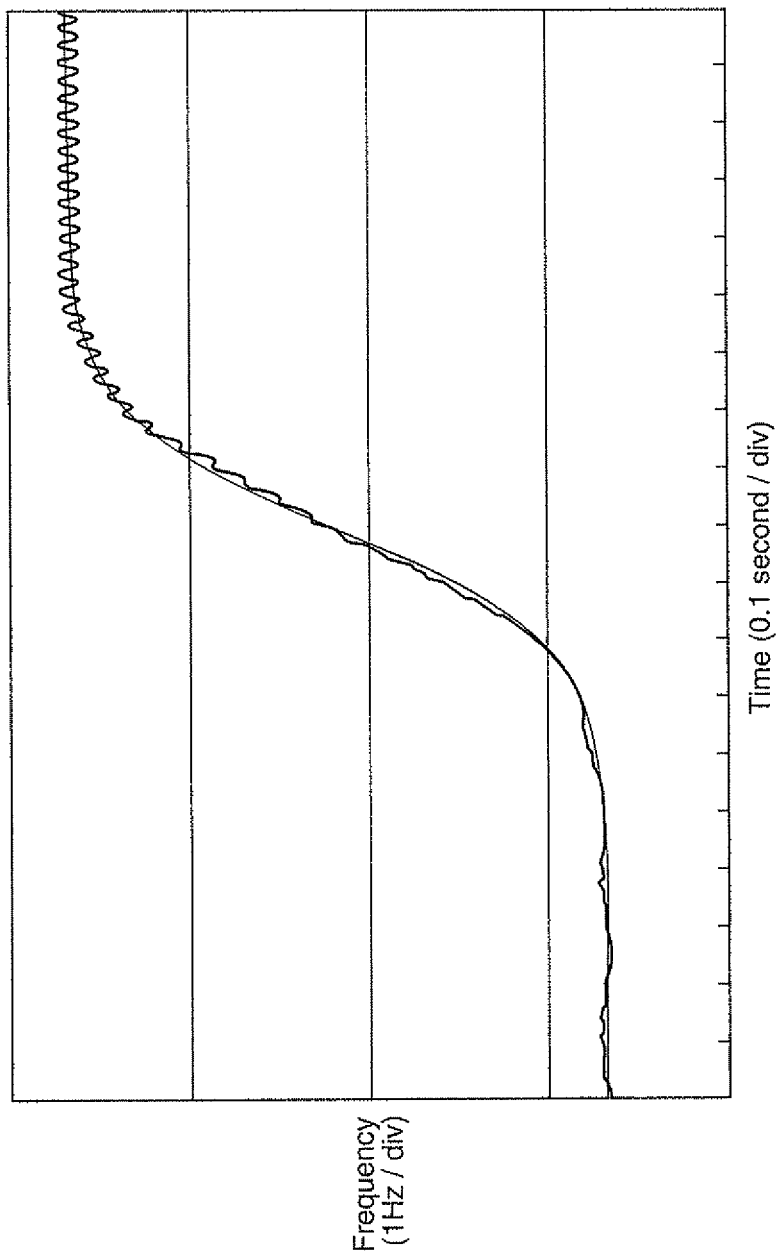
FIG. 25 is a graph showing temporal changes in the frequency of a signal to be measured, measured with a divide-by-16386 frequency-divided signal.

FIG. 25 is a graph showing temporal changes in the frequency of the signal to be measured 61, measured by using the divide-by-16386 frequency-divided signal. As shown in FIG. 25, the measured frequency has noise superposed on the actual frequency in the second half of the measuring period.

Figure 26:
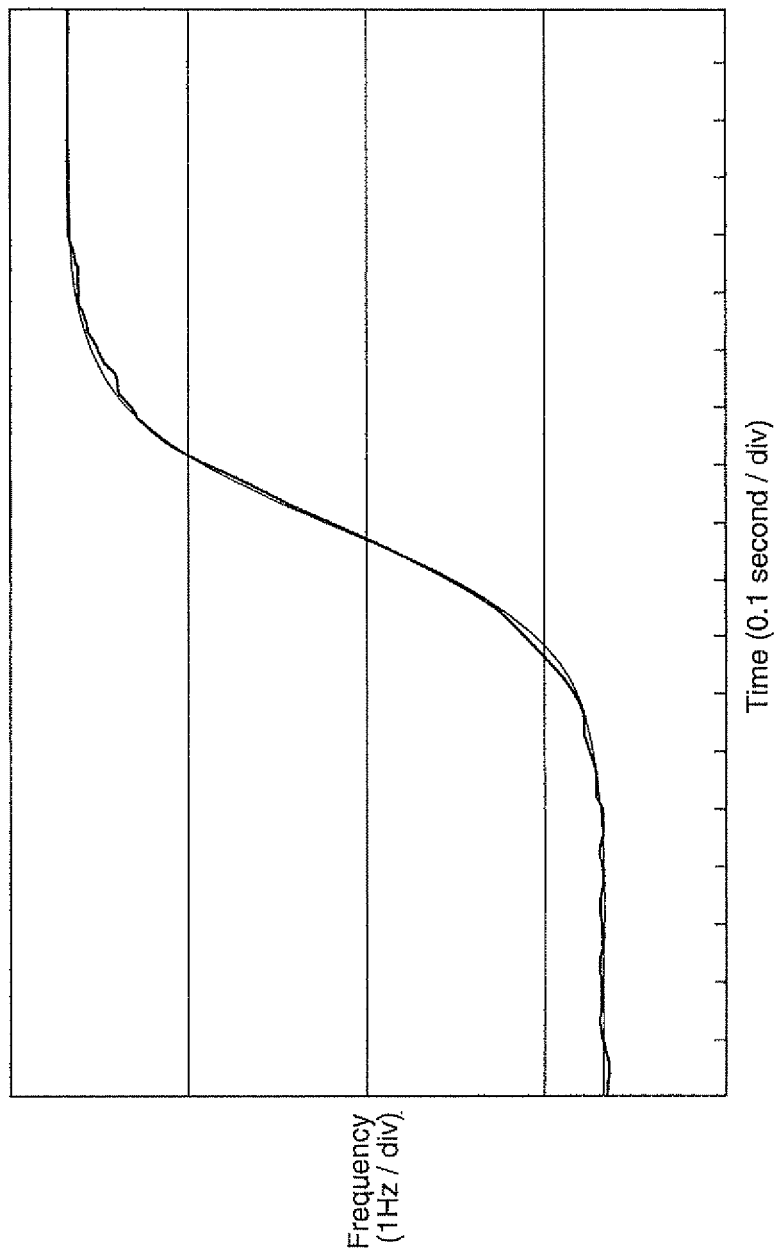
FIG. 26 is a graph showing temporal changes in the frequency of a signal to be measured, measured with a variable rate frequency-divided signal.

FIG. 26 is a graph showing temporal changes in the frequency of the signal to be measured 61, measured by using the variable rate frequency-divided signal. As shown in FIG, 26, the measured frequency has almost no noise superposed at any time, and the frequency of the signal to be measured 61 is accurately measured.

Next, a method for deciding the frequency dividing ratios for the two frequency-divided signals used for generating the variable rate frequency-divided signal and a method for deciding the mixing ratio of the two frequency-divided signals will be described. As described with reference to FIG. 8 above, pattern noise can be grasped by operation point parameters that are defined by the formula, Frequency to be measured÷Sampling frequency−Int (Frequency to be measured ÷Sampling frequency). By prohibiting the use of any combinations between the frequencies to be measured and the sampling frequencies whose operation point parameters are in neighborhood of simple rational numbers, pattern noise can be suppressed. Focusing on the short gate counter section 20 in the present embodiment, the frequency to be measured is the frequency of the signal to be measured 61, and the sampling frequency is the frequency of the variable rate frequency-divided signal 65. The frequency of the variable rate frequency-divided signal 65 that is the sampling frequency instantaneously has the frequency of the first frequency-divided signal (for example, the divide-by-16385 frequency-divided signal) or the frequency of the second frequency-divided signal (for example, the divide-by-16386 frequency-divided signal). However, in view of a relatively long period, which is subject to filtering with the moving average filter, the variable rate frequency-divided signal 65 can be considered as a signal having a specified frequency that is obtained by the first frequency dividing ratio, the second frequency dividing ratio and the mixing ratio. Here, the frequency dividing ratios and the mixing ratio can be arbitrarily decided by the variable rate frequency divider section 50. By the frequency divider section 50, it is possible to decide the first frequency dividing ratio, the second frequency dividing ratio and the mixing ratio between the first frequency-divided signal and the second frequency-divided signal in a manner that the noise level becomes lower, based on pre-obtained noise level distribution characteristics versus frequency ratios between the frequency of the variable rate frequency-divided signal 65 and the frequency of the signal to be measured 61. As a result, without using an analog circuit that would likely become large in circuit scale, the variable rate frequency-divided signal 65 that suppresses noise levels in frequency measurement can be generated.

More specifically, the first frequency dividing ratio, the second frequency dividing ratio and the mixing ratio for the variable rate frequency-divided signal 65 may be decided such that operation point parameter values defined by the fractional part of a ratio x/y where x is the frequency of the signal to be measured 61 and y is the frequency of the variable rate frequency-divided signal 65 do not become neighborhood values of specified rational numbers where the noise level in frequency measurement increases. By this, the noise level in frequency measurement can be readily suppressed.

5. Embodiment 2

Embodiment 2 in accordance with an embodiment of the invention will be described below with reference to FIGS. 27-31.

(1) Exemplary Structure of Frequency Measurement Device

Figure 27:
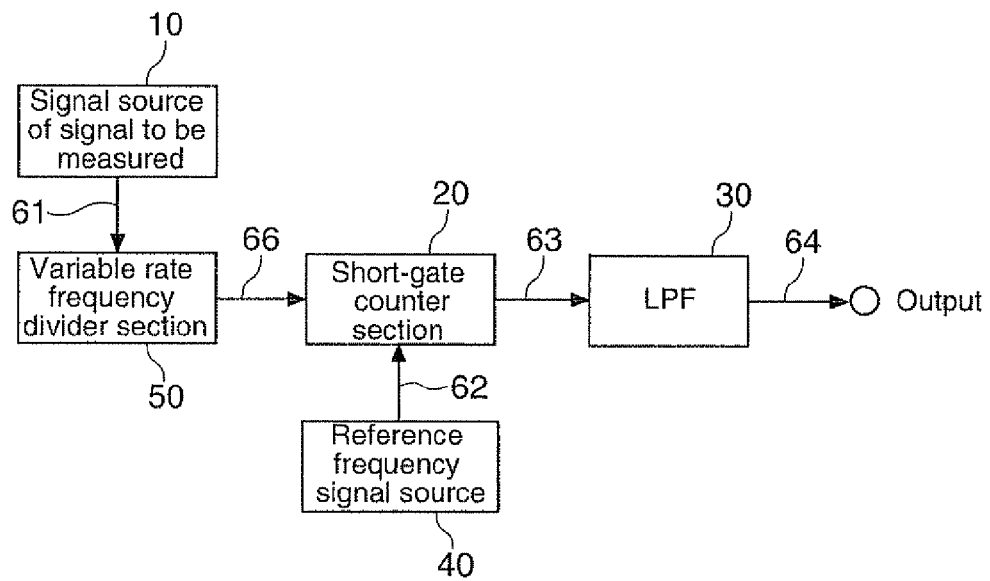
FIG. 27 is a diagram of a second exemplary structure of a frequency measurement device equipped with a variable rate frequency divider section.

FIG. 27 is a diagram showing a second exemplary structure of the frequency measurement device equipped with the variable rate frequency divider section 50. As shown in FIG. 27, the frequency measurement device is structured with a signal source of signal to be measured 10, a reference frequency signal source 40, a variable rate frequency divider section 50, a short gate counter section 20, and a low-pass filter 30. Compared to the first exemplary structure of the frequency measurement device shown in FIG. 19, the second exemplary structure is different in that the variable rate frequency divider section 50 is not disposed between the reference frequency signal source 40 and the short gate counter section 20, but is disposed between the signal source of signal to be measured 10 and the short gate counter section 20. Due to the structural difference, a variable rate frequency-divided signal 66 and a reference frequency signal 62 are supplied to the short gate counter section 20. It is noted that the signal source of signal to be measured 10, the reference frequency signal source 40 and the low-pass filter 30 have generally the same structure and function as those of the first exemplary structure described above.

Variable Rate Frequency Divider Section 50

The variable rate frequency divider section 50 is structured to generate the variable rate frequency-divided signal 66 based on the signal to be measured 61, and supply the same to the short gate counter section 20. The variable rate frequency divider section 50 is concretely described below.

(2) Exemplary Structure of Variable Rate Frequency Divider Section

Figure 28:
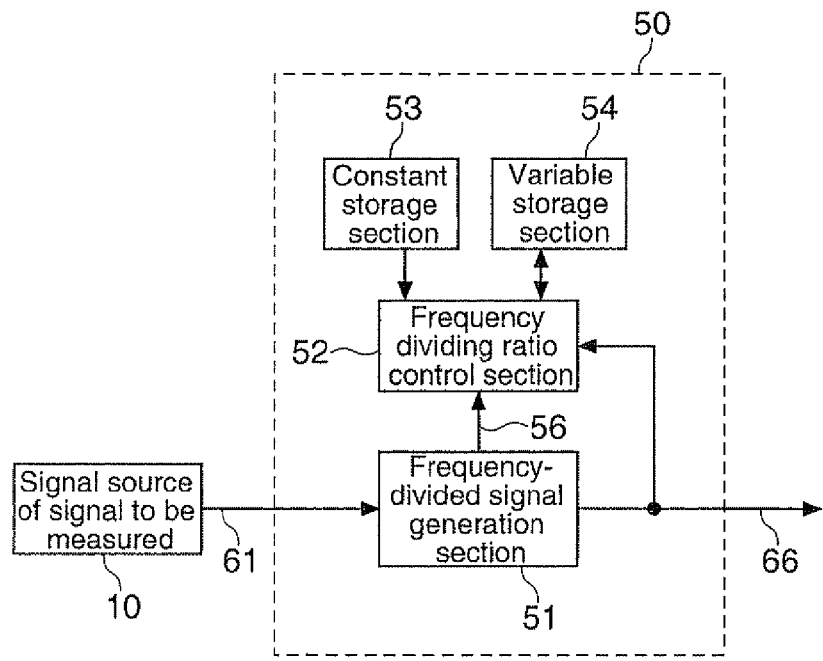
FIG. 28 is a diagram of a second concrete exemplary structure of a variable rate frequency divider section.

FIG. 28 is a diagram showing a second concrete exemplary structure of the variable rate frequency divider section 50. As is clear by comparison between FIG. 28 and FIG. 20, the variable rate frequency divider section 50 in FIG. 28 is different in that its input signal is not the reference frequency signal 62, but is the signal to be measured 61. In other words, the variable rate frequency divider section 50 according to the second exemplary structure operates in a manner similar to the first exemplary structure described above, with its input signal being replaced with the signal to be measured 61.

(3) Operation Example of Frequency Measurement Device

An example of operation of the frequency measurement device in accordance with the present embodiment is described. In accordance with the present embodiment, the reference frequency signal source 40 includes an oscillation circuit equipped with a quartz oscillator that vibrates at 30012391 Hz, and frequency-divides a signal having the frequency of 30012391 Hz by 16384 to generate and output the reference frequency signal 62. The signal source of signal to be measured 10 is equipped with a quartz oscillator that vibrates at 30014241 Hz, and generates and outputs the signal to be measured 61 having the frequency of 30014241 Hz. The variable rate frequency divider section 50 mixes signals obtained by frequency-dividing the signal to be measured 61 having the frequency of 30014241 Hz by 2 and 3, respectively, at a mixing ratio of 1:4, thereby generating a variable rate frequency-divided signal 66. In this condition, for comparison, the divide-by-2 frequency-divided signal, the divide-by-3 frequency-divided signal and the variable rate frequency-divided signal 66 described above are each supplied to the short gate counter section 20, and changes in the frequency of each of the signals are measured based on the reference frequency signal 62.

Figure 29:
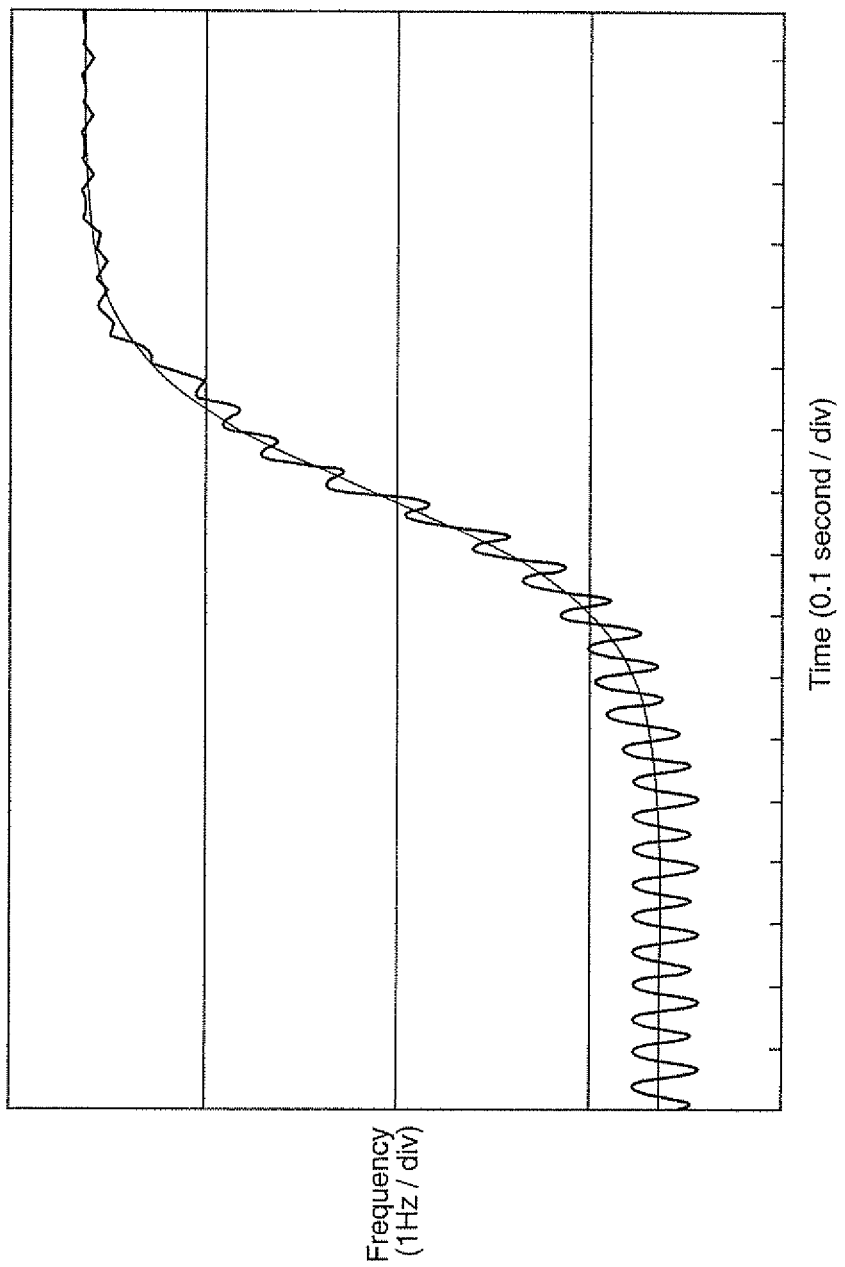
FIG. 29 is a graph showing temporal changes in the frequency of a signal to be measured, measured with a divide-by-2 frequency-divided signal of a signal to be measured.

FIG. 29 is a graph showing temporal changes in the frequency of the signal to be measured 61, measured by using the divide-by-2 frequency-divided signal of the signal to be measured 61. When the frequency measurement device measures the frequency of the signal to be measured 61 based on the divide-by-2 frequency-divided signal of the signal to be measured 61, for example, a scaling section (not shown) may be provided in a succeeding stage of the low-pass filter 30, thereby scaling the measured frequency two folds. FIG. 29 also plots temporal changes in the actual frequency of the signal to be measured 61. As shown in FIG. 29, pattern noise is superposed on the measured frequency, and appears to have greater influence in the first half of the measuring period.

Figure 30:
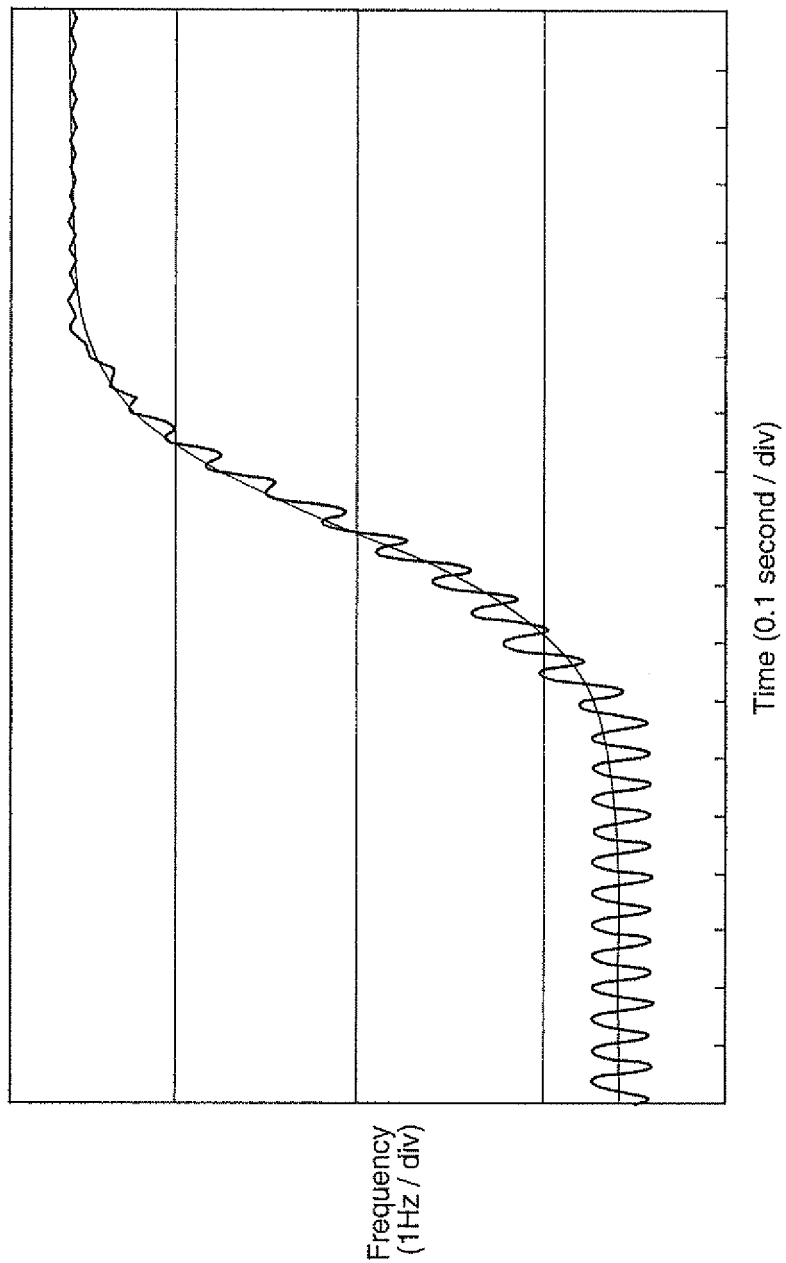
FIG. 30 is a graph showing temporal changes in the frequency of a signal to be measured, measured with a divide-by-3 frequency-divided signal of a signal to be measured.

FIG. 30 is a graph showing temporal changes in the frequency of the signal to be measured 61, measured by using the divide-by-3 frequency-divided signal of the signal to be measured 61. The scaling section provided in a succeeding stage of the low-pass filter 30 scales the measured frequency three folds. As shown in FIG. 30, pattern noise is superposed on the measured frequency, and appears to have greater influence in the second half of the measuring period.

Figure 31:
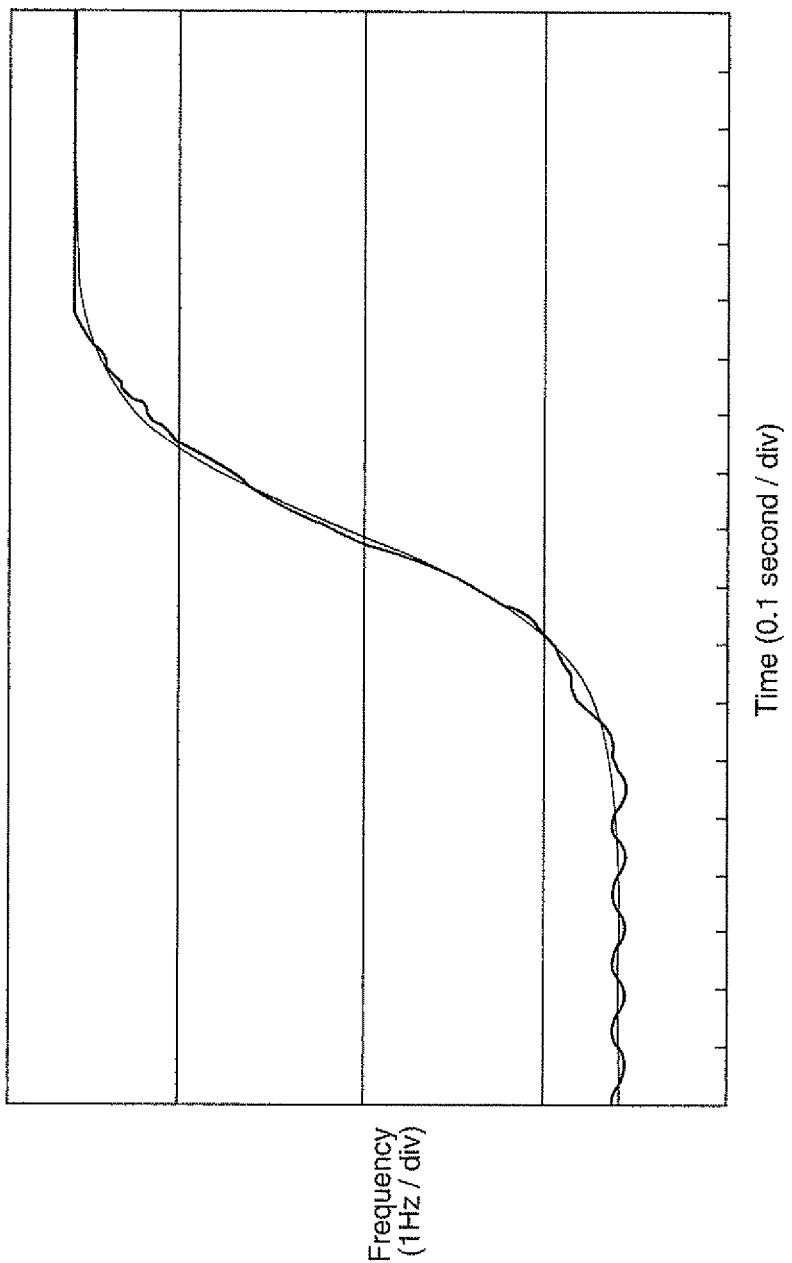
FIG. 31 is a graph showing temporal changes in the frequency of a signal to be measured, measured with a variable rate frequency-divided signal.

FIG. 31 is a graph showing temporal changes in the frequency of the signal to be measured 61, measured by using the variable rate frequency-divided signal in which the divide-by-2 frequency-divided signal and the divide-by-3 frequency-divided signal of the signal to be measured 61 are mixed at a mixing ratio of 1:4. The scaling section provided in a succeeding stage of the low-pass filter 30 scales the measured frequency 2.2 folds. The scaling can be obtained by [(the frequency dividing ratio of the first frequency-divided signal)×(the mixing ratio of the second frequency-divided signal)+(the frequency dividing ratio of the second frequency-divided signal)×(the mixing ratio of the first frequency-divided signal)] ÷ [(the mixing ratio of the first frequency-divided signal) +(the mixing ratio of the second frequency-divided signal)]. In this example, (2×4+3 ×1)÷(1+ 4)=11÷=2.2, such that the measured frequency is scaled 2.2 folds as described above. As shown in FIG. 31, the measured frequency has reduced pattern noise influence at any time.

Here, a method for deciding the frequency dividing ratios for the two frequency-divided signals used for generating the variable rate frequency-divided signal and a method for deciding the mixing ratio of the two frequency-divided signals will be described. The present embodiment is different from Embodiment 1 described above in that the signal supplied to the short gate counter section 20 is neither the signal to be measured 61 or the variable rate frequency-divided signal 65, but the variable rate frequency-divided signal 66 and the reference frequency signal 62. As described above with reference to FIG. 8 above, pattern noise can be grasped by operation point parameters that are defined by the formula, Frequency to be measured÷Sampling frequency−Int (Frequency to be measured÷Sampling frequency). In Embodiment 1, the frequency of the variable rate frequency-divided signal 65 corresponds to the sampling frequency. On the other hand, in the present embodiment, the frequency of the variable rate frequency-divided signal 66 similarly generated corresponds to the frequency to be measured. In accordance with the present embodiment, it can be considered that the frequency of the variable rate frequency-divided signal 66 corresponding to the frequency to be measured is varied by the first frequency dividing ratio, the second frequency dividing ratio and the mixing ratio between the first frequency-divided signal and the second frequency-divided signal. By the frequency divider section 50, it is possible to decide the first frequency dividing ratio, the second frequency dividing ratio and the mixing ratio between the first frequency-divided signal and the second frequency-divided signal in a manner that the noise level becomes lower, based on pre-obtained noise level distribution characteristics versus frequency ratios between the frequency of the variable rate frequency-divided signal 66 and the frequency of the reference frequency signal 62. As a result, without using an analog circuit that would likely have a large circuit scale, the variable rate frequency-divided signal 66 that suppresses noise levels in frequency measurement can be generated.

More specifically, the first frequency dividing ratio, the second frequency dividing ratio and the mixing ratio for the variable rate frequency-divided signal 66 may be decided such that operation point parameter values defined by the ratio x/y where x is the frequency of the variable rate frequency-divided signal 66 and y is the frequency of the reference frequency signal 62 do not become to be neighborhood values of specified rational numbers where the noise level increases. By this, the noise level in frequency measurement can be readily suppressed.

6. Conclusion

Two embodiments in accordance with the invention have been described above. As can be understood from the above, the signal generation circuit in accordance with each of the embodiments is structured with a first signal source for generating a first signal, and the variable rate frequency divider section 50. The first signal and the first signal source correspond to the reference frequency signal 62 and the reference frequency signal source 40, respectively, or the signal to be measured 61 and the signal source of signal to be measured 10, respectively. The variable rate frequency divider section 50 generates a variable rate frequency-divided signal 65 (or 66) in which a first frequency-divided signal obtained by frequency-dividing the first signal by a first frequency dividing ratio (for example, a divide-by-2 frequency-divided signal) and a second frequency-divided signal obtained by frequency-dividing the first signal by a second frequency dividing ratio (for example, a divide-by-3 frequency-divided signal) temporally alternately appear in a specified mixing ratio (for example, 1:4).

According to the signal generation circuit having such a structure, the variable rate frequency-divided signal 65 (or 66) including frequency components of the first frequency-divided signal and frequency components of the second frequency-divided signal in a specified mixing ratio can be generated. It is noted that the first frequency-divided signal and the second frequency-divided signal can be readily generated based on the first signal by a simple frequency divider circuit that may be of a digital circuit. In other words, without using an analog circuit that would likely become large in circuit scale, the variable rate frequency-divided signal 65 (or 66) described above can be generated. Furthermore, the signal generation circuit having the structure according to the present embodiment is suitable to be used in a frequency measurement device, and generation of pattern noise that may occur in the frequency measurement device can be suppressed.

Also, by composing the variable rate frequency divider section 50 in the signal generation circuit in a manner described above with reference to FIGS. 21 through 23, it is possible to obtain the variable rate frequency-divided signal 65 (or 66) in which the first frequency-divided signal and the second frequency-divided signal are mixed in a dispersed manner. Also, the method described above used in generating the variable rate frequency-divided signal 65 (or 66) makes it possible to readily generate a variable rate frequency-divided signal in which frequency components of the first frequency-divided signal and frequency components of the second frequency-divided signal are mixed in a specified mixing ratio in a dispersed form.

7. Supplementation

In the embodiments described above, specific numerical values are suitably used as examples, but without being limited to these values, any values that can be understood by those skilled in the art can be used in the range of the invention. In other words, frequency dividing ratios for a plurality of frequency-divided signals used for generating the variable rate frequency-divided signal 65 (or 66), and mixing ratios for mixing those frequency-divided signals can be arbitrary decided. Also, the frequency-divided signals used for generating the variable rate frequency-divided signal 65 (or 66) are not limited to two types, but frequency-divided signals in three or more types can be mixed to generate the variable rate frequency-divided signal 65 (or 66).

The embodiments described above may be used in various types of resonance frequency change type sensors, whereby their size-reduction, weight-reduction, higher resolving power, and lower cost can be achieved. Also, integration and platform implementation of various types of sensors become possible. Further, the embodiments are suitable to be applied to transducer arrays for odor sensors, gas sensors, and biosensors, QMC devices, pressure sensors, acceleration sensors and the like.

Also, the embodiments described in the present application may be mutually combined with each other within the permissible range. For example, an exemplary structure in accordance with an embodiment of the invention may be equipped with a first variable rate frequency divider section 50 that generates a first variable rate frequency-divided signal 66 based on the signal to be measured 61 and a second variable rate frequency divider section 50 that generates a second variable rate frequency-divided signal 65 based on the reference frequency signal 62. In view of the description of the embodiments above, it is readily understood that these modified structures are also capable of suppressing pattern noise.

What is claimed is:

1. A signal generation circuit comprising:
a first signal source that generates a first signal; and
a variable rate frequency divider section that generates a variable rate frequency-divided signal in which a first frequency-divided signal obtained by frequency-dividing the first signal by a first frequency dividing ratio and a second frequency-divided signal obtained by frequency-dividing the first signal by a second frequency dividing ratio temporally alternately appear in a specified mixing ratio, the variable rate frequency divider section being structured to generate the variable rate frequency-divided signal through repeating:
step 1 adding a first constant indicating a ratio of the first frequency-divided signal included in the variable rate frequency-divided signal to a first variable;
step 2-1, when the first variable after the addition becomes greater than or equal to a result of addition of the first constant and a second constant indicating a ratio of the second frequency-divided signal included in the variable rate frequency-divided signal, outputting the first frequency-divided signal, subtracting the first constant and the second constant from the first variable, and returning to step 1); and
step 2-2, when the first variable after the addition becomes smaller than a result of addition of the first constant and the second constant, outputting the second frequency-divided signal and returning to step 1.

2. A frequency measurement device comprising:
the signal generation circuit recited in claim 1;
a source of signal to be measured that generates a signal to be measured:
a counter section that outputs a count value obtained by counting the number of changes in the signal to be measured included in a specified period that is decided based on the variable rate frequency-divided signal; and
a low-pass filter that removes high frequency components included in the count value.

3. A frequency measurement device according to claim 2, the first frequency dividing ratio, the second frequency dividing ratio and the mixing ratio of the variable rate frequency-divided signal being decided based on pre-obtained noise level distribution characteristics versus frequency ratios between the frequency of the variable rate frequency-divided signal and the frequency of the signal to be measured.

4. A frequency measurement device according to claim 3, an operating point parameter being defined by the fractional part of a ratio x/y where x is the frequency of the signal to be measured and y is the frequency of the variable rate frequency-divided signal, the frequency of the signal to be measured, and the first frequency dividing ratio, the second frequency dividing ratio and the mixing ratio of the variable rate frequency-divided signal being decided such that the value of the operating point parameter does not become a neighborhood value of a specified rational number where noise level increases.

5. A frequency measurement device comprising:
the signal generation circuit recited in claim 1;
a reference frequency signal source that generates a reference frequency signal;
a counter section that outputs a count value obtained by counting the number of changes in the variable rate frequency-divided signal included in a specified period that is determined based on the reference frequency signal; and
a low-pass filter that removes high frequency components included in the count value.

6. A frequency measurement device according to claim 5, the first frequency dividing ratio, the second frequency dividing ratio and the mixing ratio of the variable rate frequency-divided signal being decided based on a pre-obtained noise level distribution characteristic versus a frequency ratio between the frequency of the variable rate frequency-divided signal and the frequency of the reference frequency signal.

7. A frequency measurement device according to claim 6, an operating point parameter is defined by the fractional part of a ratio x/y where x is the frequency of the variable rate frequency-divided signal and y being the frequency of the reference frequency signal, the frequency of the reference frequency signal, and the first frequency dividing ratio, the second frequency dividing ratio and the mixing ratio of the variable rate frequency-divided signal being decided such that the value of the operating point parameter does not become to be a neighborhood value of a specified rational number where noise level increases.

8. A signal generation method comprising:
a step of, based on a first signal having a specified frequency, generating a first frequency-divided signal obtained by frequency-dividing the first signal by a first frequency dividing ratio and a second frequency-divided signal obtained by frequency-dividing the first signal by a second frequency dividing ratio; and a process of repeating:

a step 1) of adding a first constant indicating a ratio of the first frequency-divided signal included in a variable rate frequency-divided signal to be generated to a first variable;

a step 2-1) of, when the first variable after the addition becomes greater than or equal to a result of addition of the first constant and a second constant indicating a ratio of the second frequency-divided signal included in the variable rate frequency-divided signal, outputting the first frequency-divided signal, subtracting the first constant and the second constant from the first variable, and returning to the step 1); and a step 2-2) of, when the first variable after the addition becomes smaller than a result of addition of the first constant and the second constant, outputting the second frequency-divided signal and returning to the process 1), thereby generating the variable rate frequency-divided signal in which the first frequency-divided signal and the second frequency-divided signal temporally alternately appear in a specified mixing ratio.

9. A frequency measurement device comprising:

a signal generation circuit that includes:

a first signal source that generates a first signal; and a variable rate frequency divider section that generates a variable rate frequency-divided signal in which a first frequency-divided signal obtained by frequency-dividing the first signal by a first frequency dividing ratio and a second frequency-divided signal obtained by frequency-dividing the first signal by a second frequency dividing ratio temporally alternately appear in a specified mixing ratio, a reference frequency signal source that generates a reference frequency signal;

a counter section that outputs a count value obtained by counting the number of changes in the variable rate frequency-divided signal included in a specified period that is determined based on the reference frequency signal; and a low-pass filter that removes high frequency components included in the count value, the first frequency dividing ratio, the second frequency dividing ratio and the mixing ratio of the variable rate frequency-divided signal being decided based on a pre-obtained noise level distribution characteristic versus a frequency ratio between the frequency of the variable rate frequency-divided signal and the frequency of the reference frequency signal.

10. A frequency measurement device according to claim 9, an operating point parameter is defined by the fractional part of a ratio x/y where x is the frequency of the variable rate frequency-divided signal and y being the frequency of the reference frequency signal, the frequency of the reference frequency signal, and the first frequency dividing ratio, the second frequency dividing ratio and the mixing ratio of the variable rate frequency-divided signal being decided such that the value of the operating point parameter does not become to be a neighborhood value of a specified rational number where noise level increases.

* * * * *